(12) United States Patent
Kambe et al.

(10) Patent No.: US 7,002,075 B2
(45) Date of Patent: Feb. 21, 2006

(54) INTERMEDIATE SUBSTRATE

(75) Inventors: Rokuro Kambe, Nagoya (JP);
Yukihiro Kimura, Nagoya (JP);
Yasuhiro Sugimoto, Konan (JP);
Kazuhiro Suzuki, Kasugai (JP)

(73) Assignee: NGK SPark Plug Co., Ltd., Nagoya (JP)

( * ) Notice: Subject to any disclaimer, the term of this patent is extended or adjusted under 35 U.S.C. 154(b) by 0 days.

(21) Appl. No.: 11/126,157

(22) Filed: May 11, 2005

(65) Prior Publication Data

US 2005/0207091 A1    Sep. 22, 2005

(30) Foreign Application Priority Data

Jun. 24, 2004    (JP) .............................. 2004-186275

(51) Int. Cl.
*H02G 3/08*    (2006.01)

(52) U.S. Cl. .................. 174/52.1; 174/260; 361/306.1; 361/782

(58) Field of Classification Search ............... 174/52.1, 174/260; 361/306.1, 766, 782
See application file for complete search history.

(56) References Cited

U.S. PATENT DOCUMENTS

| | | | |
|---|---|---|---|
| 6,441,314 B1 * | 8/2002 | Rokugawa et al. | ......... 174/255 |
| 6,577,490 B1 * | 6/2003 | Ogawa et al. | ......... 361/306.1 |
| 6,614,663 B1 * | 9/2003 | Yokota et al. | .............. 361/780 |
| 6,818,836 B1 * | 11/2004 | Shiraishi et al. | ............ 174/260 |
| 6,885,561 B1 * | 4/2005 | Hashemi et al. | ............ 361/760 |
| 2003/0082846 A1 | 5/2003 | Yoneda et al. | |
| 2004/0053444 A1 | 3/2004 | Yoneda et al. | |

FOREIGN PATENT DOCUMENTS

| | | |
|---|---|---|
| EP | 1 041 631 A2 | 10/2000 |
| JP | 2000-349225 | 12/2000 |
| JP | 2002-204071 | 7/2002 |
| JP | 2003-142624 | 5/2003 |

OTHER PUBLICATIONS

Kazuaki et al;."Development of Low Inductance Thin Film Decoupling Capacitor;" Electronic Packaging Technology; vol. 19, No. 1; 2003.

* cited by examiner

*Primary Examiner*—Hung V. Ngo
(74) *Attorney, Agent, or Firm*—Stites & Harbison PLLC; Ross F. Hunt, Jr.

(57) ABSTRACT

An intermediate substrate includes a substrate core formed by a main core body portion constructed of a sheet of polymer material and having a subsidiary core accommodation portion formed therein. A ceramic subsidiary core portion, which is constructed of a ceramic sheet, is accommodated in the subsidiary core accommodation portion and is of a thickness matching that of the main core body portion. A thin film capacitor is formed on a first main surface side of a plate-like base of the core portion and includes first and second thin film electrodes separated from each other by a thin film dielectric layer so as to provide direct current isolation between the electrodes. First and second direct current isolated terminals of a first terminal array are electrically connected to the first and second thin film electrodes.

23 Claims, 18 Drawing Sheets

○ : Signal terminal
● : Power terminal
⊘ : Ground terminal

INTERMEDIATE SUBSTRATE

BACKGROUND OF THE INVENTION

1. Field of the Invention

The present invention relates to capacitors and, more particularly, to a capacitor formed as part of an intermediate substrate.

2. Description of Related Art

Two prior art references of interest include a patent, Japanese Patent Application Laid-Open No. 2003-142624, and a publication entitled "Development of low inductance thin film decoupling capacitor," Kazuaki Kurihara, Electronics installation technology, Vol. 19 (2003), No. 1, page 50.

In integrated circuit devices such as a CPU and other LSI, which operate at high speeds, power supply lines are allocated to plural circuit blocks within the integrated circuit such that the supply lines branch from a common power supply. When plural devices in the circuit block switch at high speeds at the same time, a large current is immediately induced from the power supply, so that a resultant deflection in the power supply voltage produces noise which propagates to the respective circuit blocks through the power lines. This problem has been addressed by providing each circuit block with a decoupling capacitor to lower the power supply impedance. This approach is effective in suppressing the propagation of noise between circuit blocks due to the aforementioned deflection in the power supply voltage. Further, a bypass capacitor for removing external noise, such as surge noise, in the form of AC filtering is provided in the same connection configuration in some cases.

In case of a large-scale integrated circuit such as a CPU, the number of circuit blocks is large, and the quantities of power terminals and ground terminals have also been increasing, so that the distance (spacing) between the terminals has been correspondingly decreasing. The decoupling capacitor mentioned above must be connected to each power line leading to each circuit block. Because of this, it is difficult to connect each capacitor to an integrated circuit containing a large number of densely packed terminals from the viewpoint of the corresponding installation demands. Further, this approach is contrary to the current trend toward smaller size devices.

With this background, turning to the two references mentioned above, these references disclose a thin film decoupling capacitor in which a ferroelectric thin film and a metallic thin film are layered, and a number of capacitor terminals connected individually to the densely packed terminals on the integrated circuit are created using photolithography technology. In high frequency operation (particularly at frequencies of 100 MHz or more) the above-mentioned problem with respect to noise due to a deflection in the power supply voltage is likely to occur at the time of high speed switching. The reason for this is that the ratio of inductive reactance term of the power supply impedance increases, and decreasing as much as possible the distance between the power terminal connected to the decoupling capacitor and the ground terminal is effective in reducing the power supply impedance. Further, when the inductance at the terminal portion increases, the inductance is coupled with the capacitive component of the decoupling capacitor so as to produce a resonance point. This is a problem because of the decrease in the bandwidth necessary to produce a sufficient reduction in impedance. Thus, this is another problem that needs to be solved. In this regard, manufacturing a thin film capacitor having a small distance between the terminals using photolithography techniques as described above contributes not only to a reduction in size of the device but also to a reduction in the power supply impedance and an increase in bandwidth, which is the original purpose.

However, the abovementioned patent discloses a configuration in which the thin film capacitor is constructed by itself in the form of an intermediate substrate. With this configuration, because the stiffness of the thin film capacitor is not high, when the main substrate to which the capacitor is connected is a substrate comprised mainly of polymer material (such as a motherboard or an organic package substrate) which forms an intermediate substrate of the second stage, when a manufacturing process is used which involves thermal hysteresis, such as soldering reflow, the solder may peel off or the thin film capacitor itself may be damaged due to the insufficient stiffness thereof. In the latter regard, this damage may occur because the capacitor is incapable of absorbing the difference in linear expansion coefficient between the semiconductor device and the main substrate.

SUMMARY OF THE INVENTION

An object of the present invention is to provide an intermediate substrate wherein, although a thin film capacitor is employed, the stiffness of the intermediate substrate is significantly improved and wherein, although a manufacturing process involving thermal hysteresis, such as soldering reflow, is used, the substrate is capable of sufficiently withstanding thermal stress caused by the difference in linear expansion coefficient between the semiconductor device and main substrate.

To solve the above-described problem and other problems, the intermediate substrate of the present invention comprises:

a substrate core comprising a main core body portion constructed of a sheet of polymer material and including a subsidiary core accommodation portion opening at a first main surface of the main core body portion as to reduce the overall transverse thickness thereof in the region of said subsidiary core accommodation portion, and a ceramic subsidiary core portion, accommodated in said subsidiary core accommodation portion and of a thickness which, together with the transverse thickness of any remaining portion of said main core body portion in said region, matches the overall transverse thickness of said main core body portion;

a first terminal array formed on a first main surface side of said substrate core and comprising first side first terminals and first side second terminals some of which function as power terminals and others of which function as ground terminals, said first terminal array further comprising first side signal terminals; and a second terminal array formed on a second main surface side of said substrate core and comprising second side first terminals and second side second terminals which are conductively connected to said first side first terminals and said first side second terminals, respectively, and second side signal terminals conductively connected to said first side signal terminals;

said ceramic subsidiary core portion comprising a substantially planar base body and a multilayered thin film capacitor portion formed on the first main surface side of the base body and comprising a first conductive thin film electrode and a second conductive thin film electrode separated from said first electrode by a thin film dielectric layer so as to prevent direct current flow between said electrodes, said first side first terminals and said first side second terminals of said first terminal array being conductively connected to said first electrode and said second electrode, respectively, such that direct current flow between said first side first terminals and said first side second terminals is prevented. It is noted that the phrase "thin film" as used herein refers to a film having a thickness less than about 1.5 µm.

In such a thin film capacitor, the achievable electrostatic capacity can be increased largely based on the thin film effect of the dielectric layer even though the dimensions of the capacitor device are small. Such a device can be easily manufactured using a repeating patterning based on photo-lithography technology and ordinary film formation technology. In the thin film capacitor, the dielectric layers, and the first and second electrode layers can be stacked each in plural layers. In this case, the coupling conductor portion, which couples two thin film electrodes of the same kind with each other, can be formed as a thin film portion, which is formed with at least one of the two thin film electrodes. Further by connecting a capacitor which functions as a decoupling capacitor (or path capacitor) directly to a semiconductor in the form of an intermediate substrate, the decoupling capacitor can be brought closer to the semiconductor device, so that the length of wiring between a power terminal and the decoupling capacitor can be reduced. Consequently, the inductance of a capacitor terminal portion can be reduced, thereby contributing to a reduction of the impedance of the decoupling capacitor. Further, because the decoupling capacitor is accommodated in the intermediate substrate, the necessity of disposing the decoupling capacitor on the rear side of a main substrate as another device is eliminated, so that the quantity of components can be reduced or a reduction in the overall size of the device can be achieved.

According to one aspect of the present invention, part of the substrate core is replaced with a ceramic subsidiary core portion having the aforementioned thin film capacitor portion in an area just below the first terminal array on a side to which the semiconductor integrated circuit device is flip chip connected. When part of the substrate core is replaced with a ceramic having a smaller linear expansion coefficient than that of a polymer material, the difference in linear expansion coefficient between the semiconductor integrated circuit device and the intermediate substrate is reduced at the first terminal array position, thereby making it possible to effectively prevent the occurrence of a fault such as breaking of wiring or electrical connection between the semiconductor integrated circuit device and intermediate substrate that is flip chip connected thereby, due to thermal stress.

The aforementioned patent discloses a configuration in which, after a thin film capacitor portion is formed on a silicon substrate and a semiconductor device is mounted on a thin film capacitor portion, provides that the silicon substrate is peeled so as to transform the thin film capacitor portion into an intermediate substrate by itself. This configuration requires many steps in peeling off the silicon substrate and the thin film capacitor portion from which the substrate is peeled does not have substantial stiffness, which is a disadvantageous point. Thus, when the main substrate of a connection destination is comprised mainly of a polymer material, when thermal hysteresis such as soldering reflow is applied, the difference in linear expansion coefficient between the semiconductor device and main substrate cannot be absorbed completely, thereby possibly leading to such faults as peeling off of the solder and damage to the thin film capacitor itself due to its insufficient stiffness. However, because the intermediate substrate of the present invention includes a plate-like base body which serves as a film formation base for the thin film capacitor portion as a component of the intermediate substrate, the step of peeling off the base body becomes unnecessary and the stiffness of the intermediate substrate is significantly improved, thereby effectively preventing an occurrence of the above-described faults.

Next, according to the abovementioned patent, as shown in FIG. 2 thereof, a wiring portion for conversion of terminal interval (indicated by reference numeral 32 in the patent: the third conductor layer) is provided at the uppermost position in addition to the capacitor electrode, and thus, not only the manufacturing process is prolonged due to the increase in the number of layers but also a lengthy wiring portion is formed at a position connected directly to the terminal portion of the semiconductor device. Thus, the inductance of the terminal portion is substantially increased, so that it is difficult to achieve a lower impedance and wide band operation. On the side of the first main surface of the thin film capacitor, the first side first terminals and the first side second terminals are disposed, each in plural quantities, at a predetermined interval, and those first side first terminals and first side second terminals are coupled with the first electrode conductor thin film and the second electrode conductor thin film nearest to the first main surface, in the layering direction directly, or through an auxiliary coupling conductor portion. With this structure, the conductor portion directly connected to the terminals is an electrode conductor thin film, i.e., thin film electrode, which acts as a thin film capacitor portion or an auxiliary coupling conductor portion, in the layering direction conductive with, i.e., conductively connected to, that electrode conductor thin film. Consequently, the lengthy wiring portion as mentioned in the patent, which may result in an increase in inductance, can be effectively excluded and further, lower impedance and wide band operation in the thin film capacitor portion can be achieved. Because the necessity of providing the lengthy wiring portion in addition to an electrode conductor layer is eliminated, the structure is simplified, thereby also simplifying the manufacturing process.

In the first terminal array, the distance between the edges of different types of terminals closest or most adjacent, to each other is preferably between 20 µm and 300 µm. When part of a decoupling capacitor the above-mentioned different type terminals comprise one type of terminal that functions as a power terminal and another type that functions as a ground terminal. By spacing these terminals both less than 300 µm, in terms of the distance between their edges, the apparent inductance of the terminal portion can be reduced due to the mutually inductive canceling effect of the opposite phases of the AC waveform current flowing through the different type terminals, thereby further decreasing the impedance of the thin film capacitor portion.

In the thin film capacitor portion, the thickness of the dielectric thin film is preferably, for example, between 10 nm and 1000 nm. When the thickness of the dielectric thin film is less than 10 nm, the separation condition worsens in terms of direct current flow between the electrode conductor thin films, created by the dielectric thin film, so that leakage of current can conceivably occur. Further, when the thickness of the dielectric thin film exceeds 1000 nm, the advantages produced by the reduction in size and the increased capacitance inherent in thin film capacitors can no longer be realized. More preferably, the thickness of the electrode conductor thin film is between 30 nm and 500 nm. On the other hand, when for example, a metallic thin film is used, the thickness thereof is preferably between 10 nm and 500 nm. When the thickness of the metallic thin film which forms the electrode conductor thin film is less than 10 nm, the sheet resistance of the thin film increases and, therefore, from the viewpoint of the equivalent circuit diagram, an increased DC resistance component is added in series with a lumped capacitor. When this construction is employed as a decoupling capacitor, path capacitor or the like, the impedance reduction effect may be lost, thereby potentially leading to a narrowing of the operational bandwidth due to formation of a RC series resonant circuit. Further, using an electrode conductor thin film having a thickness of more than 500 nm results in an increase in cost. More preferably, the thickness of the electrode conductor thin film is between 50 nm and 300 nm.

In the thin film capacitor portion, for each of the same type electrode conductor thin films coupled through the coupling conductor portion, the coupling conductor portions conductive with the electrode conductor thin film are preferred to be formed in plural quantities on the same main surface side in order to block reduction of inductance and increase of DC resistance. In this case, for these plural coupling conductor portions, the distance between the edges of the different type conductor portions closest or most adjacent to each other is preferably between 20 $\mu$m and 300 $\mu$m. When the distance between the edges is less than 20 $\mu$m, a short-circuit is likely to occur between the different type coupling conductor portions, which portions should be separated sufficiently to prevent direct current flow. Further, it is difficult to charge the dielectric layer in between the coupling conductor portions, i.e., to provide a dielectric layer of a substantially uniform and effective thickness between these portions, so that a fault, such as a gap, is likely to occur. When the distance between the edges exceeds 300 $\mu$m, an increase in DC resistance in the thin film capacitor portion is likely to occur. On the other hand, when the different type coupling conductor portions are separated by a distance of less than 300 $\mu$m, the apparent inductance in the coupling conductor portion can be reduced due to mutually inductive canceling effect of the opposite phases of the AC waveform current flowing through the different type coupling conductor portions and further, a low impedance in the thin film capacitor portion can be achieved. Moreover, because photolithography technology can be adopted for the present invention, when the intermediate substrate is used as a decoupling capacitor for an integrated circuit having a number of power terminals or ground terminals, the intermediate substrate can be formed easily and with high precision, even though density of the coupling conductor portions is great, with a spacing on the order of $\mu$m.

Further, the distance between the edges of the different type terminals that are closest or most adjacent in the first terminal array is preferably between 20 $\mu$m and 300 $\mu$m. When the capacitor portion is used as a decoupling capacitor, one of the different type terminals functions as a power terminal while the other functions as a ground terminal. By separating both of the terminal types by a distance between the edges of less than 300 $\mu$m, the apparent inductance of the terminal portion can be reduced, due to the mutually inductive canceling effect of the opposite phases of the AC waveform current flowing through the different type terminals and consequently, the impedance of the thin film capacitor portion can be lowered further.

When the first main surface of the layered body is constructed of the aforementioned thin film capacitor portion, the distance between the edges of the different type terminals most adjacent in the first terminal array is preferably between 20 $\mu$m and 300 $\mu$m. When the thin film capacitor portion is used as a decoupling capacitor, one of the different type terminals functions as a power terminal while the other functions as a ground terminal. By separating both terminal types by distance between the edges thereof of less than 300 $\mu$m, the apparent inductance of the terminal portion can be reduced due to the mutually inductive canceling effect of the opposite phases of the AC waveform current flowing through the different type terminals and consequently, the impedance in the thin film capacitor portion can be further lowered.

The electrode conductor thin film and the coupling conductor portion, which constitute the thin film capacitor portion, can be constituted of a metal such as Cu, Ag, Au and Pt and the formation thereof can be effectively carried out using a vapor phase film formation method such as sputtering and vacuum deposition. On the other hand, when the dielectric thin film and dielectric in-hole charging portion is formed of an inorganic dielectric material, such as a oxide and nitride, using such a vapor phase film formation method as high frequency sputtering, reactive sputtering, chemical vapor deposition (CVD) is effective. An oxide base dielectric thin film can be formed using a chemical solution deposition (CSD), such as the so-called Sol-Gel processing method. The chemical solution deposition method is a method for obtaining dielectric thin film by drying or baking a coating layer of a solution which is a raw material for a compound which constitutes the dielectric thin film, and has the advantage that the dielectric thin film can be formed more easily than with the vapor phase film formation method. For example, according to the Sol-Gel processing method, the Sol-like compound of the organic metallic solution is applied onto a plate-like base body and dried and baked so as to obtain the dielectric thin film (for example, an oxide thin film).

Particularly when it is desired to obtain a thin film capacitor having a high electrostatic capacitance or it is desired to further reduce in size a thin film capacitor having the same capacitance, using a dielectric material having a higher dielectric constant is advantageous. For this purpose, it is preferable that the dielectric thin film and dielectric in-hole charging portion are constructed of high dielectric constant ceramic (which is herein defined as a ceramic whose relative dielectric constant is 50 or more such as, for example, a ferroelectric ceramic). The dielectric thin film composed of high dielectric constant ceramic, when constructed of at least one or more of composite oxides having a perovskite type crystalline structure, such as barium titanate, strontium titanate and lead titanate, has a particularly high dielectric constant and the dielectric thin film can be easily manufactured. Thus, such a dielectric thin film is preferably used in some embodiments of the present invention. However, when the crystallinity of the dielectric thin film composed of high dielectric constant ceramic is lost, the dielectric constant substantially drops. Therefore, the dielectric thin film should be constructed as a crystalline thin film. When a vapor phase film formation method such as sputtering is adopted, the crystallization can be accelerated by forming the film while heating the plate-like base body, and when a chemical solution deposition method such as the Sol-Gel processing method is adopted, the crystallization of the film can be accelerated by a baking treatment after drying.

Preferably, the plate-like base body used for the intermediate substrate of the present invention should be formed of a greater thickness than that of the thin film capacitor portion so as to increase the stiffness of the entire intermediate substrate. Further, the material of the plate-like base body is preferably selected so as to reduce the difference in expansion coefficient between the semiconductor device (which, for example, is made of silicon) and the intermediate substrate, and between the intermediate substrate and a main substrate comprised mainly of polymer material, and to also reduce the level of thermal shearing stress applied to each of the terminals formed on both faces of the intermediate substrate at the time of solder reflow, so as to prevent solder peeling at these terminals. The linear expansion coefficient of silicon for the range from room temperature to near 300° C. used for solder reflow, is as low as 2–3 ppm/° C. and conversely, the linear expansion coefficient of polymer material, such as an epoxy resin constituting the main substrate (mother board or organic package substrate), is as high as 17–20 ppm/° C. Because when the dielectric layer constituting the thin film capacitor portion is a high dielectric constant ceramic, its linear expansion coefficient is relatively high, i.e., about 12–13 ppm/° C. in case of the aforementioned Perovskite type oxide, forming the plate-like base body of ceramic material having a lower linear expansion coefficient than this is effective in reducing the difference in the linear expansion coefficients and in reducing the shearing stress applied to the terminal. Considering some examples of such a ceramic material, alumina (7–8 ppm/° C.) or a glass ceramic produced by adding an inorganic ceramic filler such as alumina to borosilicate glass or borosilicate lead glass in the weight proportion of 40–60 can be used. Further, other ceramic materials such as aluminum nitride, silicon nitride, mullite, silicon dioxide, and magnesium oxide can be used. On the other hand, with respect to the use of materials other than ceramics as reference technology, it is possible to use silicon because its linear expansion coefficient is similar to that of the semiconductor device. (However, it is necessary to consider using an insulator portion providing insulation from the thin film capacitor portion and a conductor portion conductive with the thin film capacitor.)

Due to the above-described difference in linear expansion coefficient, a relative displacement in the in-plane direction between terminals can potentially occur between the semiconductor device and the intermediate substrate, and between the intermediate substrate and the main substrate. However, this displacement tendency is absorbed by the solder coupling between the terminals and thus, a shearing stress is applied to the soldered connecting portion between the terminals. In this case, the plate-like base body which occupies a major portion of the intermediate substrate is preferably constructed of a ceramic material having a higher Young's modulus than the high dielectric constant ceramic which constitutes the dielectric thin film in the thin film capacitor. Consequently, the stiffness of the plate-like base body is increased and, although there still exists some difference in the linear expansion coefficients, the amount of elastic deformation of the plate-like base body is small. Consequently, any displacement due to a shearing deformation applied to the soldered connecting portion is reduced, so that a fault such as peeling of the connecting portion or breaking of the wire is unlikely to occur.

The plate-like base body can be constructed as a layered ceramic capacitor base body in which a baked ceramic dielectric layer and an electrode conductor layer baked at the same time as the baked ceramic dielectric layer are alternately layered. Consequently, the electrostatic capacity of the entire capacitor can be increased by the thin film capacitor portion and the baked type layered ceramic capacitor created on the side of the plate-like base body. Further, a parallel combination of the thin film capacitor portion having a relatively large capacitance and the layered ceramic capacitor having a smaller capacitance can be realized in a device and consequently, an impedance reduction effect can be secured over a wider frequency band depending on the application. Although the dielectric layer used for the layered ceramic capacitor can be constructed of a paraelectric ceramic such as alumina and glass ceramic, the dielectric layer used for the layered ceramic capacitor is preferably constructed of a high dielectric constant ceramic (e.g., of the aforementioned Perovskite type oxide layer) so as to increase the capacitance.

In preferred embodiments, the first terminal array is formed at a position which, when the first terminal array is projected orthogonally to a reference plane parallel to a plane face of the substrate core, the projected image thereof is entirely included in the projected area of the ceramic subsidiary core portion. Because the aforementioned configuration is of a structure in which the ceramic subsidiary core portion, which is adjusted in its dimensions so as to cover the entire area of the first terminal array which is flip chip connected to the semiconductor integrated circuit device, is "buried" or otherwise received fully within, the substrate core, the difference in linear expansion coefficient between all of the terminals within the first terminal array and the side of the semiconductor integrated circuit device can be sufficiently reduced and any breaking of the wiring connection, or the like, due to thermal stress is unlikely to occur. This result is particularly remarkable in the case where the ceramic subsidiary core portion covers formed of an area equal to or larger than the corresponding area of the first terminal array.

In another embodiment which solves the above-described problems, the intermediate substrate of the present comprises:

a substrate core comprising a main core body portion constructed of a sheet of polymer material and including a subsidiary core accommodation portion opening at a first main surface of the main core body portion so as to reduce the overall transverse thickness thereof in the region of said subsidiary core accommodation portion, and a subsidiary core portion, constructed of a material having a smaller linear expansion coefficient than said main core body portion, accommodated in said subsidiary core accommodation portion and having a thickness which, together with the transverse thickness of any remaining portion of said main core body portion in said region, matches the overall transverse thickness of said main core body portion;

a first terminal array formed on a first main surface side of said substrate core and comprising first side first terminals and first side second terminals some of which function as power terminals and others of which function as ground terminals, said first terminal array further comprising first side signal terminals; and a second terminal array formed on a second main surface side of said substrate core and comprising second side first terminals and second side second terminals which are conductively connected to said first side first terminals and said first side second terminals, respectively, and second side signal terminals conductively connected to said first side signal terminals;

said first terminal array being disposed at a position overlapping a resultant projected area of said subsidiary core portion produced by geometric projection of said subsidiary core portion orthogonally onto a reference plane parallel to a planar face of said substrate core, and said intermediate substrate further comprising, accommodated in said subsidiary core portion, a multilayered capacitor, comprising, in order, a first conductive electrode layer, a dielectric layer and a second conductive electrode layer, and conductively connected to said first side second terminals and said second side second terminals.

The above-described configuration is of a structure in which the subsidiary core portion comprised of a material having a smaller linear expansion coefficient than that of the main core body comprised of polymer material is "buried" in the substrate core so that the subsidiary core portion overlaps the first terminal array that is flip chip connected to one side of the semiconductor integrated circuit device. Thus, the difference in the linear coefficient of expansion between the terminals of the first terminal array and the semiconductor integrated circuit device side can be sufficiently decreased, and thus breaking of the electrical connection or the like due to thermal stress is much more unlikely to occur. Further, because the subsidiary core portion corresponding to the second intermediate substrate is buried in the main core body portion corresponding to the first intermediate substrate, the height of the entire connecting structure between the semiconductor integrated circuit device using the intermediate substrate and the main substrate can be reduced and the number of the connecting steps can also be reduced. Further, a capacitor functioning as a decoupling capacitor (or passcon) can be connected directly to a semiconductor device in the form of an intermediate substrate and, as a consequence, the resultant decoupling capacitor can be positioned close to the semiconductor device. As a result, the length of the wiring connection between the power terminal and the decoupling capacitor can be reduced so as to thereby reduce the inductance of the capacitor terminal portion, thereby contributing to a reduction in the impedance of the decoupling capacitor. Further, because the decoupling capacitor is incorporated in the intermediate substrate, it is not necessary to position the decoupling capacitor on the rear side of the main substrate as in some prior art devices, and thus the number of components can be reduced and the overall size of the device can also be reduced.

In accordance with yet another embodiment thereof, the intermediate substrate of the present invention comprises:

a substrate core comprising a main core body portion constructed of a sheet of polymer material and including subsidiary core accommodation portion opening at a first main surface of the main core body portion so as to reduce the overall transverse thickness thereof in the region of said subsidiary core accommodation portion, and a subsidiary core portion, constructed of material having a coefficient of linear expansion smaller than that of said main core body portion, accommodated in said subsidiary core accommodation portion and of a thickness which, together with the transverse thickness of any remaining portion of said main core body portion in said region, matches the overall transverse thickness of said main core body portion;

a first terminal array formed on a first main surface of said substrate core and comprising first side first terminals and first side second terminals functioning as power terminals and ground terminals, respectively, and first side signal terminals; and a second terminal array formed on a second main surface of said substrate core and comprising second side first terminals and second side second terminals, conductively connected to said first side first terminals and said first side second terminals, and second side signal terminals conductively connected to said first side signal terminals;

said first terminal array being positioned entirely within a projected area of said subsidiary core portion geometrically projected orthogonally into a reference plane parallel to a planar face of said substrate core and said substrate further comprising a multilayered capacitor, comprising first and second conductive electrode layers separated by a dielectric layer, conductively connected to said first side second terminal and said second side second terminals and accommodated in said subsidiary core accommodation portion.

Because the above-described configuration is of a construction in which the dimensions of the subsidiary core portion are selected or adjusted so as to include the entire area of the first terminal array that is flip chip connected to the side of the semiconductor integrated circuit device and the subsidiary core portion is buried within the substrate core, the difference in the coefficient of linear expansion between the terminals of the first terminal array and the semiconductor integrated circuit device is significantly reduced and, as a consequence, breaking of the wiring, terminal disconnection or the like, due to thermal stress is unlikely to occur. Further, because the subsidiary core portion corresponding to the second intermediate substrate is buried in the main core body portion corresponding to the first intermediate substrate, the height of the entire connecting structure between the semiconductor integrated circuit device using the intermediate substrate and the main substrate can be reduced and the number of connecting processes can also be reduced. Further, a capacitor functioning as a decoupling capacitor (or passcon) can be connected directly to a semiconductor device in the form of an intermediate substrate and as a consequence, the resultant decoupling capacitor can be positioned close to the semiconductor device. As a result, the length of the wiring connection between the power terminal and the decoupling capacitor can be reduced so as to reduce the inductance of the capacitor terminal portion, thereby contributing to a reduction in the impedance of the decoupling capacitor. Further because the decoupling capacitor is incorporated in the intermediate substrate, it is not necessary to position the decoupling capacitor on the rear side of the main substrate as in some prior art devices and thus the quantity of components can be reduced and the size of the device can also be reduced.

The above-described advantages of the present invention are particularly significant where the subsidiary core portion extends over an area equal to or larger than the corresponding area covered by the first terminal array.

The subsidiary core portion is not restricted to being made from any particular material when the linear expansion coefficient is smaller than that of the main core body portion. However, given that the linear expansion coefficient of polymer materials is relatively high, forming the subsidiary core portion as a ceramic subsidiary core portion comprised of ceramic is convenient from viewpoint of achieving a significant reduction in the difference in linear expansion coefficients with respect to the semiconductor integrated circuit device.

For the ceramic constituting the ceramic subsidiary core portion or the ceramic formed as a plate-like base body, it is possible to use alumina (7–8 ppm/° C.) or a glass ceramic (for example, a composite material produced by adding an inorganic ceramic filler such as alumina to borosilicate glass or borosilicate lead base glass in the weight portion of 40–60). The former, i.e., alumina, has a particularly small linear expansion coefficient in various kinds of ceramics, and provides a significant reduction in the difference in linear expansion coefficients with respect to the semiconductor integrated circuit device. On the other hand, the latter is easy to bake at low temperatures and when a metallic wiring portion or via conductor is formed as required, the ceramic can be baked together with a high conductivity metallic material having a relatively low melting point comprised mainly of Cu or Ag.

Further, the ceramic subsidiary core portion can be constructed of a composite material (for example, a composite material of a polymer material and a ceramic having a content ratio in weight higher than the main core body portion) when the condition that the linear expansion coefficient be smaller than the main core body portion is satisfied.

On the other hand, the ceramic which constitutes the ceramic subsidiary core portion can be comprised of a glass material, for example, a silica base glass having skeletal composition of silicon dioxide (silica). In this case, it is possible to mix various kinds of glass additive components, except $SiO_2$, in order to adjust the physical properties thereof so as to be suitable for a particular application of the ceramic dielectric material. For the aforementioned glass material, mixing of an alkali metallic oxide such as $Na_2O$, $K_2O$ or $Li_2O$ or $B_2O_3$ (boric acid) as a fluxing agent is effective in enhancing the fluidity of the molten glass and in suppressing the presence of bubbles or the like. On the other hand, by adding an alkaline earth metal such as BaO or SrO, the dielectric constant characteristic of the glass material can be improved. However, an excessive addition is likely to produce an increase in the linear expansion coefficient of the glass and further, an increase in the difference in linear expansion coefficient with respect to component side. The latter can in some instances lead to a connection failure due to thermal stress. Further, the decrease in fluidity can be significant due to an increased in the glass softening point, thereby sometimes producing a fault such as the retention of bubbles in the glass.

To suppress any increase in the linear expansion coefficient of the glass, the content ratio of the $SiO_2$ component can be increased or ZnO can be mixed in as glass additive component. On the other hand, an oxide of Ti, Zr and Hf or the like is effective in not only improving the dielectric constant characteristic of the glass but also in improving the water resistance of glass. However, an excessive addition can produce a significant decrease in fluidity because the glass softening point increases, thereby potentially leading to the retention of bubbles in the glass.

The ceramic which constitutes the ceramic subsidiary core portion or the ceramic formed as a plate-like base body, preferably has a Si content ratio of between 68 mass % and 99 mass % under a conversion based on $SiO_2$, and because a cation component other than Si is constituted of an oxide forming cation which forms an oxide having a larger linear expansion coefficient than $SiO_2$ in a temperature range from a room temperature to 200° C., the ceramic can be constructed of an oxide base glass material whose average linear expansion coefficient from 1 ppm/° C. at room temperature up to between 200° C. is adjusted to between 1 ppm/° C. and 7 ppm/° C.

The linear expansion coefficient of $SiO_2$ in the temperature range from room temperature up to 200° C. is small, i.e., as small as around 1 ppm/° C., and by constructing the subsidiary core portion or the plate-like base body with the aforementioned glass material containing an oxide formation cation which forms an oxide having a larger linear expansion coefficient than $SiO_2$, the linear expansion coefficient of the glass material can be freely adjusted to an arbitrary value of 1 ppm/° C. or more depending on the kind and content amount of the oxide formation cation. As a result, the use of a subsidiary core portion made of this glass material significantly reduces the difference in linear expansion coefficient with respect to a semiconductor integrated circuit device on which the core portion is to be mounted, so that the reliability of the terminal connection to the semiconductor integrated circuit device made by a flip chip connection or the like can be significantly improved.

When the semiconductor integrated circuit device of a connection member is a Si semiconductor component, the linear expansion coefficient of the oxide base glass material preferably adjusted to between 1 ppm and 6 ppm, and more particularly between 2 ppm/° C. and 5 ppm/° C., because the linear expansion coefficient of Si is around 3 ppm/° C. On the other hand, when the semiconductor integrated circuit device of a connection member is a compound semiconductor component comprised of a III–V family compound which is lattice coherent with GaAs, the linear expansion coefficient of the oxide base glass material is preferably adjusted to between 4 ppm/° C. and 7 ppm/° C. because the linear expansion coefficient of the semiconductor is about 5–6 ppm/° C. In any case, the thermal shearing stress, based on a difference in linear expansion coefficient between the component and substrate, is significantly decreased with respect to a terminal connection structure with the semiconductor integrated circuit device, mounted on the subsidiary core portion, thereby significantly reducing the probability of the occurrence of a fault such as a rupture in the connection.

In this case, when the content ratio of $SiO_2$ which is an oxide base glass material constituting the subsidiary core portion or the plate-like base body is less than 68 mass %, it is difficult to maintain the linear expansion coefficient of a glass material of 7 ppm/° C. or less, and the difference in linear expansion coefficient relative to the semiconductor component cannot be sufficiently reduced. When the content ratio exceeds 99 mass %, the glass melting point increases and consequently, the manufacturing costs of an excellent quality glass containing only a few retained bubbles is increased. Further, it can be difficult to secure a linear expansion coefficient of glass material over 1 ppm/° C.

With respect to a candidate oxide having a larger linear expansion coefficient than $SiO_2$, use can be made of various oxides such as an alkali metal oxide ($Na_2O$, $K_2O$, $Li_2O$: 20–50 ppm/° C.), an alkaline earth metal oxide (BeO, MgO, CaO, SrO, BaO: 8–15 ppm/° C.), ZnO (6 ppm/° C.), and $Al_2O_3$ (7 ppm/° C.). These oxides are to be selected after appropriate consideration of the dielectric property, melting point and glass fluidity thereof. With respect to the content of $SiO_2$, the content ratio of $SiO_2$ is preferably between 68 mass % and 99 mass % (and more preferably between 80 mass % and 85 mass %) so as to maintain the linear expansion coefficient in the above-mentioned range, while the remaining portion can be constituted of the above-mentioned linear expansion coefficient adjustment oxide.

Specific examples of the glass compositions that can be employed in embodiments of the present invention are as follows: $SiO_2$: 80.9 mass %, $B_2O_3$: 12.7 mass %, $Al_2O_3$: 2.3 mass %, $Na_2O$: 4.0 mass %, $K_2O$: 0.04 mass %, $Fe_2O_3$: 0.03 mass %; softening point: 821° C., linear expansion coefficient (average from 20° C. to 200° C.): 3.25 ppm/° C.

Further features and advantages of the present invention will be set forth in, or apparent from, the detailed description of preferred embodiments thereof which follows.

DETAILED DESCRIPTION OF PREFERRED EMBODIMENTS

Hereinafter, various embodiments of the present invention will be described with reference to the accompanying drawings.

Figure 1:
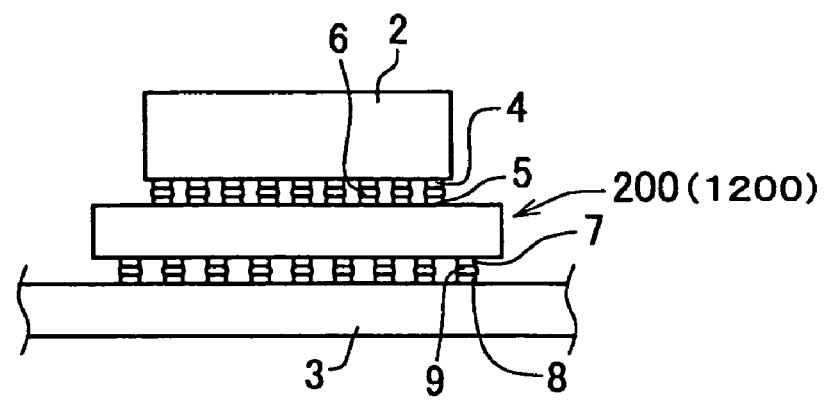
FIG. 1 is a schematic side elevational view employing an embodiment of the intermediate substrate of the present invention.

FIG. 1 shows an example in which an intermediate substrate 200 in accordance with a first embodiment of the present invention is constructed as an intermediate substrate disposed between a semiconductor integrated circuit device 2 and a main substrate 3. According to this embodiment, a first main surface of a sheet-like or substantially planar member is assumed to be a surface on the upper side as viewed. In FIG. 1 and a second main surface is assumed to be a surface on the lower side.

The semiconductor integrated circuit device 2 has a device side terminal array 4 comprising pluralities of signal terminals, power terminals and ground terminals on the second main surface, and is "flip chip" connected to a first terminal array 5 formed on the first main surface of the intermediate substrate 200 through a solder connection portion 6. On the other hand, the main substrate 3 is preferably a mother board or an organic layered package substrate. These kinds of substrates are mainly comprised of a polymer material containing ceramic particles or fibers as filler. Substrate 3 is connected to second terminal array 7 formed on the second main surface of the intermediate substrate 200 at a main substrate side terminal array 8 comprised of soldered balls or metallic pins, through a solder connection 9.

Figure 4:
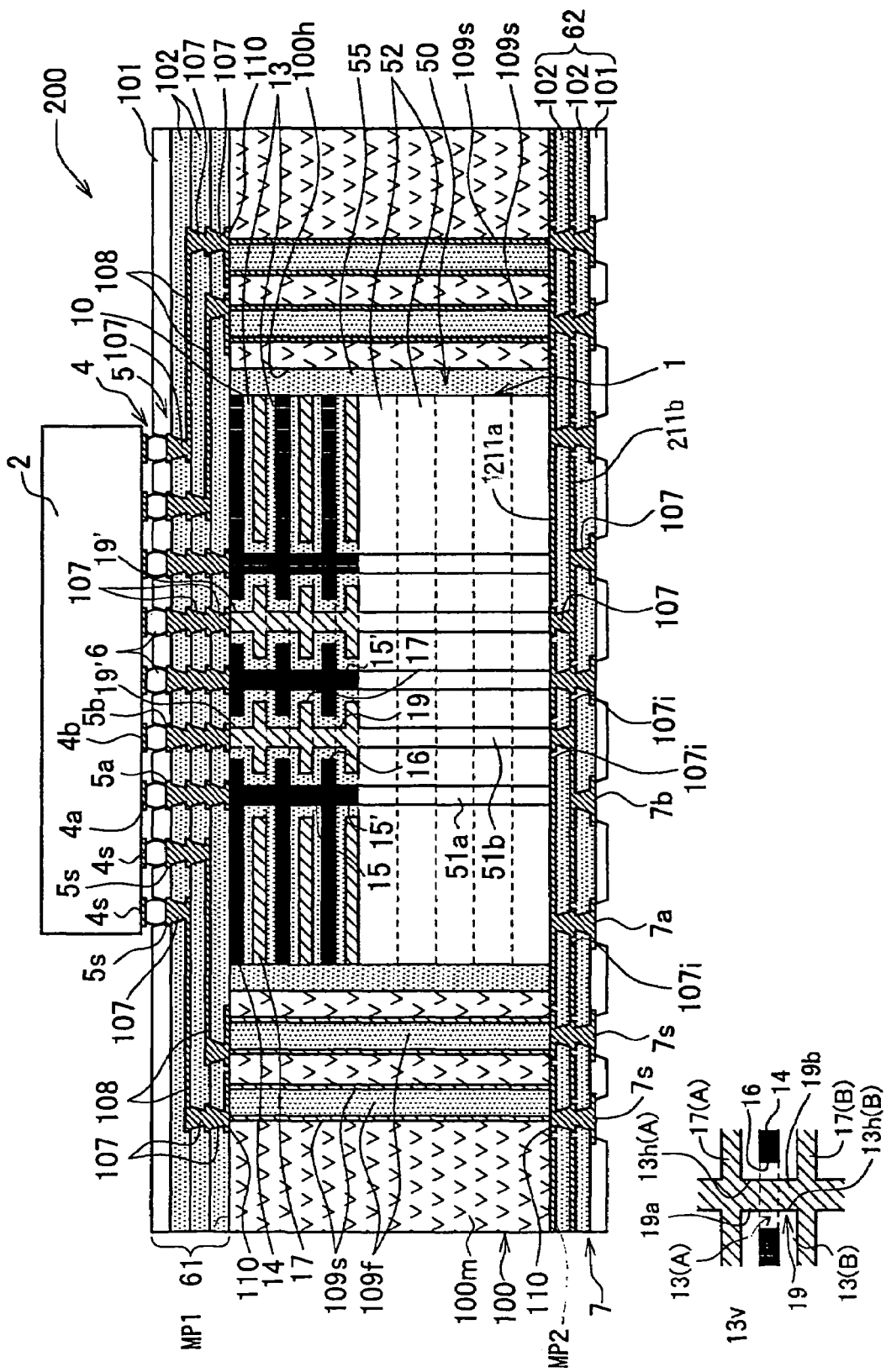
FIG. 4 is a schematic cross-sectional view of a first preferred embodiment of the intermediate substrate of the present invention.

As shown in FIG. 4, the intermediate substrate 200 includes a substrate core 100 comprising a core main body 100m, which is formed of polymer material in the shape of a sheet and in which a subsidiary core accommodation portion 100h is formed so as to open at a first main surface so as to thus reduce the thickness thereof, and a ceramic subsidiary core portion 1 which is constructed of a ceramic also in the form of a sheet. Core portion 1 is accommodated in the subsidiary core accommodation portion 100h and is of a thickness equal to that of the core main body portion 100m.

On the first main surface side of the substrate core 100 is formed a first terminal array 5 comprising first side first terminals 5a, first side second terminals 5b and first side signal terminals 5s, some of which function as power terminals while others function as ground terminals.

The core main body 100m (also referred to herein as the main core body) is constructed in the form of a sheet of, for example, heat-resistant resin plate (for example, bismare-imid-triazine), fiber reinforced resin plate (for example, glass fiber reinforced epoxy resin) or the like.

On the second main surface side of the substrate core 100, a second terminal array 7, comprising second side first terminals 7a and second side second terminals 7b each conductive with the first side first terminals 5a and the first side second terminals 5b and second side signal terminals 7s conductive with the first side signal terminals 5s, is formed. Then, the first terminal array 5 is formed at a position in which when it is projected orthogonally to a reference surface (for example, can be set up in the first main surface MP1 of the substrate core 100), it is entirely included within the projection region of a ceramic subsidiary core portion 1. A charged coupling layer 55 composed of polymer material is formed in a space acting as a gap between the ceramic subsidiary core portion 1 and the core main body portion 100m within the subsidiary core accommodation portion 100h. This charged coupling layer 55 fixes the ceramic subsidiary core portion 1 to the core main body portion 100m and absorbs differences in linear expansion coefficient in facial direction and thickness direction between the ceramic subsidiary core portion 1 and the core main body portion 100m.

Figure 3:
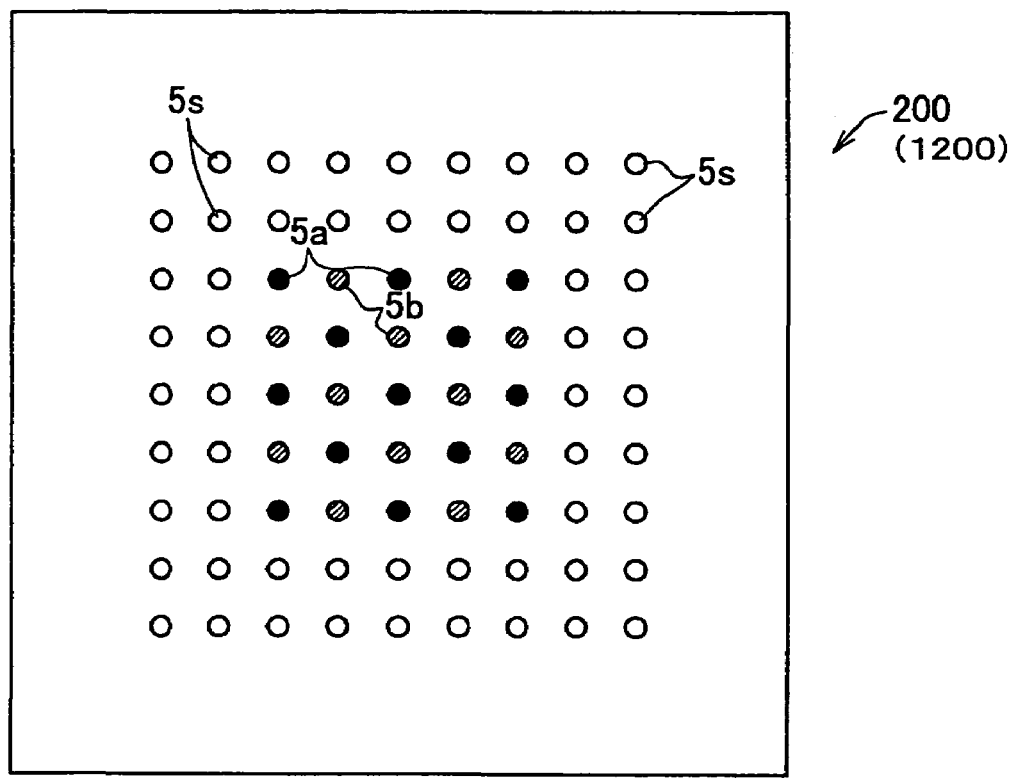
FIG. 3 is a plan view of a first terminal array of the intermediate substrate of FIG. 1.

As shown in FIG. 3, the first side first terminal 5a and the first side second terminal 5b are disposed in grid configuration deflected alternately (or staggered configuration) within the first terminal array 5. Likewise, the second side first terminals 7a and the second side second terminals 7b are disposed in the grid configuration deflected alternately (or staggered configuration) within the second terminal array 7 corresponding to the terminal arrangement of the first terminal array 5. Any of the arrays 5, 7 has a plurality of the first side signal terminals 5s and the second side signal terminals 7s such that they surround the grid-like arrangement of the power terminals and the ground terminals.

As shown in FIG. 4 (FIG. 13 described later also), in the substrate core 100, the first main surface of the core main body portion 100m and the first main surface of the ceramic subsidiary core portion 1 are covered by first wiring layer portion 61 (so-called built-up wiring layer) in which dielectric layer 102 and conductive layer containing a facial conductor for wiring, grounding or power supply are layered alternately. The first terminal array 5 is formed on the first main surface (MP1) of the first wiring layer portion 61 such that it is exposed. Because according to this configuration, the ceramic subsidiary core portion 1 is covered with the first wiring layer portion 61 in batch together with the core main body portion 100$m$, the first wiring layer portion 61 and the first terminal array 5 can be formed through substantially the same process as an ordinary built-up type organic package substrate, thereby contributing to simplification of manufacturing process. Further, the second main surface (MP2) of the substrate core 100 is covered with a second wiring layer portion 62 in which the dielectric layer 102 composed of polymer material and conductive layer containing facial conductor for wiring, grounding or power supply are layered alternately and the second terminal array 7 is formed on the first main surface of the second wiring layer portion 62 such that it is exposed.

In any of the wiring layer portions 61, 62, the dielectric layer 102 is formed in the thickness of, for example, 20 $\mu$m or more to 50 $\mu$m or less as a built-up layer composed of resin compound such as epoxy resin. According to this embodiment, the dielectric layer 102 is composed of epoxy resin, which is produced by mixing dielectric filler composed of $SiO_2$ in the ratio of 10 mass % or more to 30 mass % or less and its relative dielectric constant $\epsilon$ is adjusted to 2–4 (for example, about 3). Further, in any of the wiring and facial conductor, the conductive layer is formed in the thickness of for example, 10 $\mu$m or more to 20 $\mu$m or less as a pattern plating layer (for example, electrolytic copper plating layer) on the dielectric layer 102.

A via conductor 107 in the wiring layer portions 61, 62 has such a structure in which the via hole is made in the dielectric layer 102 according to such a well-known method as photo via process (the dielectric layer 102 is formed of photo-sensitive resin compound, for example, ultraviolet-curing epoxy resin) and laser boring via process (the dielectric layer 102 is formed of non-photo-sensitive resin compound) and the inside face thereof is charged with or covered with via conductor such as plating layer. The respective wiring layer portions 61, 62 are covered with solder resist layer 101 composed of photo-sensitive resin compound such that the terminal arrays 5, 7 are exposed.

Next, the ceramic subsidiary core portion 1 has such a structure in which the thin film capacitor portion 10 is bonded to the first main surface of a plate-like base body 50. That is, the ceramic subsidiary core portion 1 includes the plate-like base body 50 which serves as film formation base of the thin film capacitor portion 10 as its component. Therefore, the base body separation process, which is mentioned in the patent document 1, becomes unnecessary and the stiffness of the intermediate substrate is improved largely.

For the plate-like base body 50, well-known ceramic green sheet containing raw material powder of composition ceramic and metallic powder paste charged in a via hole formed by punching, laser boring or the like are layered and baked so as to form subsidiary core conductors 51$a$, 51$b$, 51$s$ described later as a layered via conductor. As for the composition ceramic material of the plate-like base body 50 (ceramic portion 52), it is permissible to use alumina (7–8 ppm/° C.) or glass ceramic produced by adding inorganic ceramic filler such as alumina to borosilicate base glass or borosilicate lead base glass in the weight portion of 40–60. As other ceramic material, it is permissible to use aluminum nitride, silicon nitride, mullite, silicon dioxide, magnesium oxide or the like. More specifically, the plate-like base body 50 is formed thicker than the thin film capacitor portion 10 (for example, 100 $\mu$m or more to 2 mm or less) and according to this embodiment, the ceramic portion 52 is composed of alumina or glass ceramic. That material has a linear expansion coefficient which is intermediate between silicon constituting the semiconductor integrated circuit device 2 and polymer material which is a main component of the main substrate 3 and has a higher Young modulus than high dielectric ceramic which constitutes the dielectric thin film 13. In the meantime, as reference technology, the plate-like base body 50 can be replaced with a silicon subsidiary core portion from viewpoint that the linear expansion coefficient is similar to that of the semiconductor device.

The thin film capacitor portion 10 of the ceramic subsidiary core portion 1 is constituted by layering plural dielectric thin films 13 and plural electrode conductor thin films 14, 17 alternately so as to form the capacitor. The first terminal 5$a$ and the second terminal 5$b$ are formed on the first main surface side of the thin film capacitor portion 10 such that they are separated from each other in terms of direct current. As for the electrode conductor thin films 14, 17, the first electrode conductor thin film 14 conductive with the first terminal 5$a$ and the second electrode conductor thin film 17 conductive with the second terminal 5$b$ are arranged alternately in the layering direction such that they are separated by the dielectric thin film 13.

Referring to FIG. 4, as exemplified partially in enlargement, between one same type electrode conductor thin film (second electrode conductor thin film) and the other same type electrode conductor thin film 17(B) disposed adjacent to each other in the layering direction are arranged a first dielectric thin film 13(A), other type electrode conductor thin film (first electrode conductor thin film) 14, and second dielectric thin film 13(B) in this order. A first through hole 13$h$(A) formed in the first dielectric thin film 13(A) and a second through hole 16 formed in the other type electrode conductor thin film 14 overlap each other when the one is projected in-plane with the other and the second through hole 16 and a third through hole 13$h$(B) formed in the second dielectric thin film 13(B) overlap each other when the one is projected in-plane with the other (in this exemplified portion, these through holes are disposed coaxially with circular section.) Then, coupling conductor portion 19, which couples the one same type electrode conductor thin film 17(A) with the other same type electrode conductor thin film 17(B), is formed so that it charges the first through hole 13$h$(A) and the third through hole 13$h$(B). The external peripheral face of the coupling conductor portion 19 is separated from the internal peripheral face of the second through hole 16 in terms of direct current by a dielectric in-hole charging portion 13$v$, which is integrated with the first dielectric thin film 13(A) and the second dielectric thin film 13(B) in the second through hole 16. In the above-mentioned structure, a structure in which the first electrode conductor thin film 14 and the second electrode conductor thin film 17 are reversed is formed also. According to this embodiment, a first coupling conductor thin film portion 19$a$ is projected from the one same type electrode conductor thin film 17(A) and a second coupling conductor thin film portion 19$b$ is projected from the other same type electrode conductor thin film 14(B) and in the second through hole 16, the first coupling conductor thin film 19$a$ and the second coupling conductor thin film 19$b$ are coupled with each other so as to form an integral coupling conductor portion 19 (the front end of the coupling conductor portion projecting from the one same type electrode conductor thin film may be coupled directly with the other same type electrode conductor thin film.)

Figure 5:
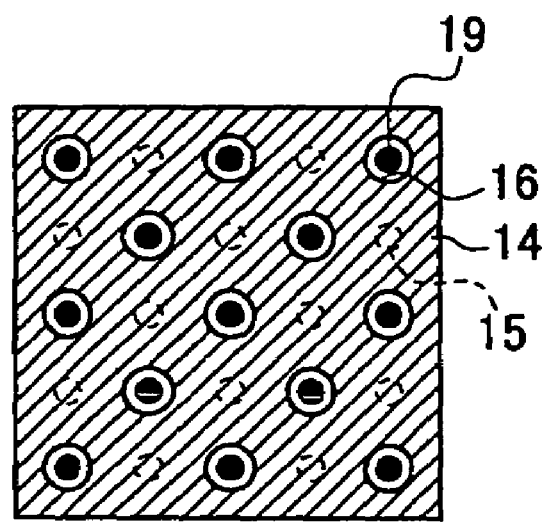
FIG. 5 is a schematic plan view of an electrode conductive layer of a capacitor incorporated in the intermediate substrate o FIG. 1.
Figure 5:
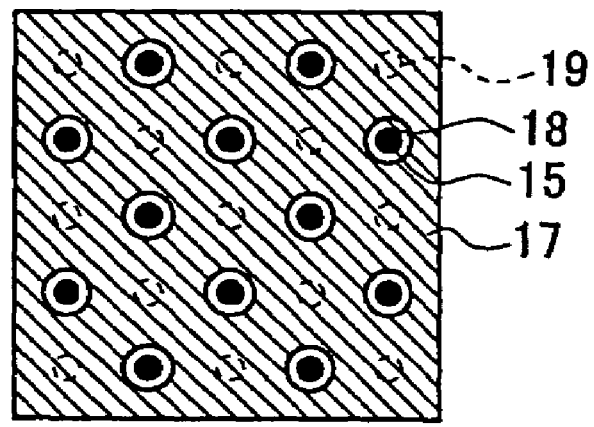

The total area is increased by multiple layers of the electrode conductor thin films 14, 17 and at the same time, the dielectric layer provides thin film effect. As a result, the electrostatic capacity which can be achieved can be increased largely although the dimension of the device is small. Although the electrode conductor thin films 14, 17 look to be divided in in-plane direction by the representation of the through holes 16, 18, actually, continuous thin film is formed in in-plane direction at other portions than the through holes 16, 18 as shown in FIG. 5. The same thing can be said of the dielectric thin film 13.

Preferably, the thickness of the dielectric film 13 is, for example, 10 nm or more to 1000 nm or less, more preferably 30 nm or more to 500 nm or less. On the other hand, preferably, the thickness of the electrode conductor thin films 14, 17 is, for example, 10 nm or more to 500 nm or less, more preferably 50 nm or more to 500 nm or less. The electrode conductor thin films 14, 17 and the coupling conductor portion 15 (19) can be composed of such metal as Cu, Ag, Au and Pt and is formed according to vapor phase film formation method such as sputtering, vacuum deposition method. According to this embodiment, it is formed according to the vacuum deposition method. On the other hand, the dielectric thin film 13 and the dielectric in-hole charging portion 13v are composed of inorganic dielectric material such as oxide and nitride and formed according to such vapor phase film formation method as high frequency sputtering, reactive sputtering, chemical vapor deposition (CVD). According to this embodiment, the dielectric thin film 13 and the dielectric in-hole charging portion 13v are formed of composite oxide having Perovskite type crystal structure, for example, oxide thin film composed of for example, barium titanate, strontium titanate and one or two kinds of titanates is formed according to Sol-Gel processing method.

In the same type of the electrode conductor thin film 14 (17) coupled by the coupling conductor portion 15 (19), a plurality of the coupling conductor portions 15 (19), conductive with the electrode conductor thin film 14 (17) on the side of the same main surface are formed for each electrode conductor thin film 14 (17) to prevent an increase in DC resistance. More specifically, the coupling conductor portions 15 (19) are formed dispersingly in the same quantity as each terminal of the first terminal array 5. The plural coupling conductor portions 15 (19) are of different type and the distance between the most neighboring ones is set to 20 $\mu$m or more to 300 $\mu$m or less.

The first terminal 5a and the second terminal 5b within the first terminal array 5 are coupled with the first electrode conductor thin film 14 and the second electrode conductor thin film 17 of the thin film capacitor portion 10, that is, nearest its first main surface in the layer thickness direction directly (on the side of the first electrode conductor thin film 14 according to this embodiment) or an auxiliary coupling conductor portion 19' (on the side of the second electrode conductor thin film 17 according to this embodiment) through via conductors in the first wiring layer portion 61. The edge gap between the most neighboring first terminal 5a and second terminal 5b is 20 $\mu$m or more to 300 $\mu$m or less. Although when used as the decoupling capacitor 1, one of these different type terminals functions as a power terminal while the other one functions as a ground terminal, when both of them are approached in an edge gap of 300 $\mu$m or less, apparent inductance can be reduced by cancel effect of opposite phases of AC waveforms flowing through different type terminals, thereby contributing to lower impedance of the capacitor 1. Further, the same effect is generated between the neighboring different type coupling conductor portions 15 and 19.

On the other hand, in the ceramic subsidiary core portion 1, a first subsidiary core conductor 51a and a second subsidiary core conductor 51b, which correspond to the first side first terminals 5a and the first side second terminals 5b of the first terminal array 5 and are conductive with the second side first terminals 7a and the second side second terminals 7b of the second terminal array 7, are formed in the thickness direction of the ceramic subsidiary core portion 1. These first subsidiary core conductor 51a and the second subsidiary core conductor 51b are formed in the sheet-like base body 50 and coupled with the first electrode conductor thin film 14 and the second electrode conductor thin film 17 nearest the first main surface of the plate-like base body 50 in the direction of the layer thickness directly (on the side of the second electrode conductor thin film 17 according to this embodiment) or through an auxiliary coupling conductor portion 15' (on the side of the first electrode conductor thin film 14 according to this embodiment). By forming the conductors 51a, 51b for ground and power in the plate-like base body 50 of ceramic in parallel to each other, lower inductance of a path for ground and power and further lower impedance can be achieved.

Then, the first subsidiary core conductor 51a and the second subsidiary core conductor 51b are conductive with the first side first terminals 5a and the first side second terminals 5b through the via conductor 107 formed so as to go through the respective dielectric layer 102 of the first wiring layer portion 61. The first subsidiary core conductor 51a and the second subsidiary core conductor 51b are coupled with a second side first facial conductor 211a and a second side second facial conductor 211b within the second wiring layer portion 62 through the via conductor 107. Further, the second side first terminals 7a and the second side second terminals 7b of the aforementioned second terminal array 7 are connected to these second side first facial conductor 211a and the second side second facial conductor 211b.

The first terminal array 5 is formed in a positional relation in which it is entirely included in projection area of the ceramic subsidiary core portion 1 when it is projected orthogonally to a reference plane parallel to the plate face of the substrate core 100. That is, all the first side first terminals 5a, the first side second terminals 5b and the first side signal terminals 5s are flip chip coupled with the semiconductor integrated circuit device 2 (device side terminal array 4 thereof) on the ceramic subsidiary core portion 1. Consequently, the difference in linear expansion coefficient between all the terminals in the first terminal array 5 and the side of the semiconductor integrated circuit device 2 can be reduced sufficiently, thereby making cutting of wire or the like due to thermal stress unlikely to occur. In the intermediate substrate 200 of FIG. 4, the ceramic subsidiary core portion 1 is formed with a larger area than the formation area of the first terminal array 5 so that the thermal stress reduction effect is raised.

Next, as shown in FIG. 3, of the first terminal array 5 (and the second terminal array 7), the first side first terminals 5a and the first side second terminals 5b are disposed in the array inside area and the first side signal terminals 5a are disposed in the array outside area. As shown in FIG. 4 (as well as FIG. 13 described later), in the first wiring layer portion 61, a first signal wiring 108 which extracts a signal transmission path outside of the arrangement area of the ceramic subsidiary core portion 1, is provided so as to be conductive with the first side signal terminals 5s. The final end of the first side signal wiring 108 is conductive with a signal through hole conductor 109s formed in the thickness direction of the core main body 100m such that it bypasses the ceramic subsidiary core portion 1.

In the device side terminal array 4 of the semiconductor integrated circuit device 2, its signal terminals 4s are disposed at each narrow gap like the terminals 4a, 4b for power and ground and the signal terminal 4s located on the outer periphery of the array often cannot help projecting out of the ceramic subsidiary core portion 1 because a distance in in-plane direction between those signal terminal 4s and corresponding second side signal terminals 7s in the second terminal array formed on the rear side of the intermediate substrate 200 (intermediate substrate 1200). However, with the above-described structure, the device side signal terminal 4s and the first side signal terminals 5s connected by soldering can be located just above the ceramic subsidiary core portion 1 having an remarkable linear expansion coefficient difference reduction effect and conductivity can be formed to the second side signal terminals 7s located sufficiently far without any problem.

According to this embodiment, the signal transmission path bypasses the ceramic subsidiary core portion 1 due to the first side signal wiring 108 within the first wiring layer portion 61 and does not pass through the interior of the thin film capacitor portion 10. Thus, the first electrode conductor thin film 14 and the second electrode conductor thin film 17 of the thin film capacitor portion 10 are formed so as to include a position just below the first side signal terminals 5s. Consequently, the areas of the first electrode conductor thin film 14 and the second electrode conductor thin film 17 can be expanded so that the electrostatic capacity of the thin film capacitor portion 10 can be increased.

The through hole conductor formed in the core main body portion 100m has a section along the axial direction larger in diameter than the via conductor 107 formed in the wiring layer portions 61, 62. Such a through hole conductor can be formed by, for example, boring a through hole such that it goes through the core main body portion 100m in the direction of the plate thickness with a drill or the like and covering its inside face with metal layer by Cu plating or the like. The interior of the through hole conductor is charged with resin hole filling material 109f such as epoxy resin. Further both end faces of the through hole conductor are sealed with conductor pads 110. When it is desired to separate the via conductor 107 and the conductor pad 110 from the facial conductors such as power layer and ground layer in terms of direct current, this purpose is achieved by forming a hole portion 107i in the facial conductor and disposing the via conductor 107 or the conductor pad 110 inside the hole portion across a circular gap.

In the intermediate substrate 200 of FIG. 4 (as well as the intermediate substrate 1200 of FIG. 13 described later), the subsidiary core accommodation portion 100h is constructed so as to go through the core main body portion 100 and the second wiring layer portion 62 is formed so as to be in contact with the second main surface of the ceramic subsidiary core portion 1 accommodated in the subsidiary core accommodation portion 100h. Because under this configuration, the core main body portion 100m composed of mainly polymer material having a high linear expansion coefficient is excluded from the position of the ceramic subsidiary core portion 1, the reduction effect of the linear expansion coefficient difference between the semiconductor integrated circuit device 2 and the intermediate substrate 200 (intermediate substrate 1200) can be remarkably achieved.

Figure 6:
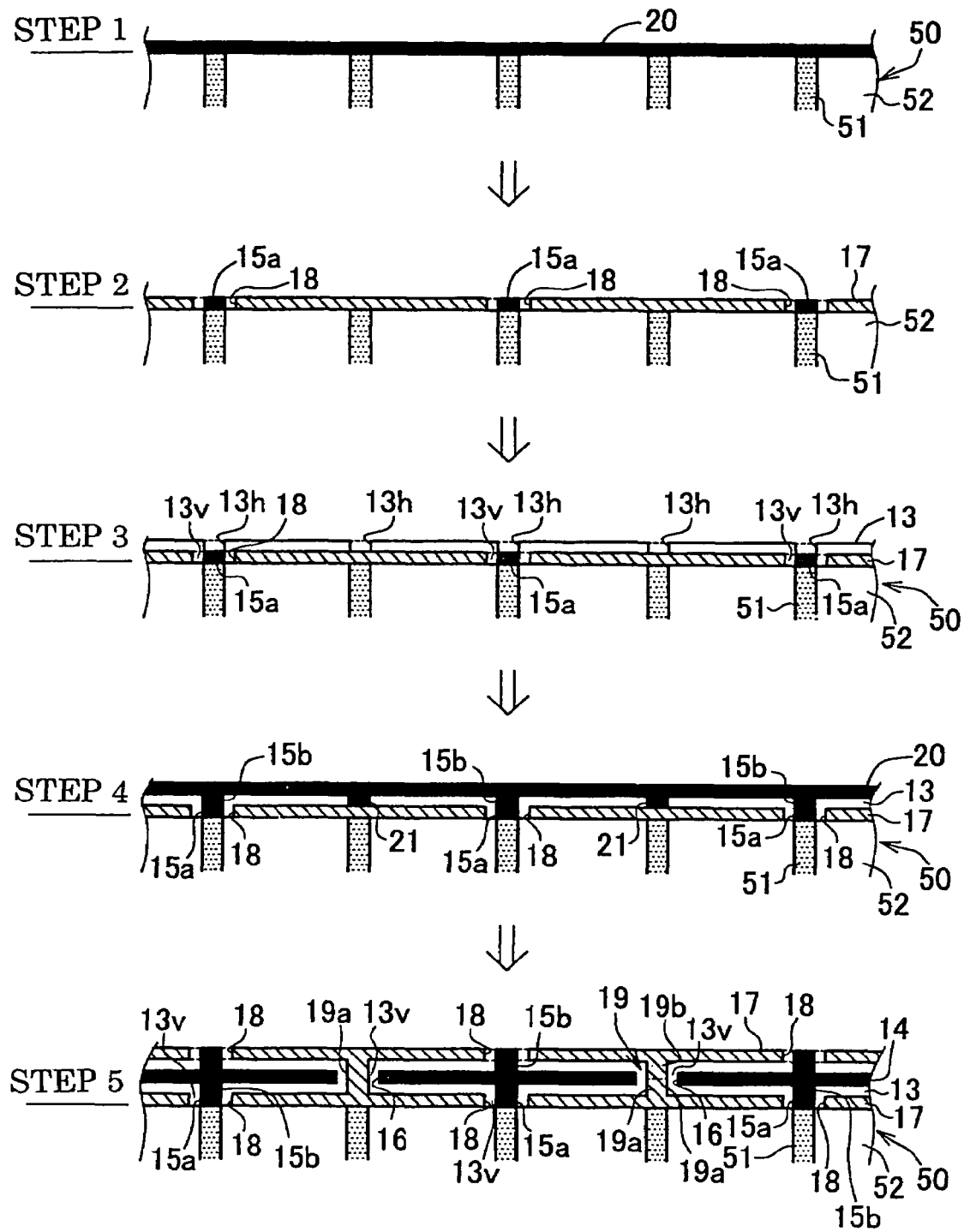
FIG. 6 is a series of side elevational views showing different steps in a manufacturing method of the thin film capacitor portion of the intermediate substrate of FIG. 1.

The ceramic subsidiary core portion 1 having the thin film capacitor portion 10 can be manufactured for example, through the process shown in FIG. 6. The plate-like base body 50 is prepared, in which the aforementioned subsidiary core conductor is formed as layered via conductor by overlaying well-known ceramic green sheets containing raw material powder of composition ceramic of the base body and metallic paste charged in a via hole formed by punching or laser boring or the like and baking them.

Next, the metallic thin film 20 is formed on the first main surface of the plate-like base body 50 as shown in step 1. Then, the procedure proceeds to step 2, and in order to separate the first electrode conductor thin film 14 and the second electrode conductor thin film 17 from viewpoints of direct current, the formed metallic thin film 20 eliminates coupling with unnecessary coupling conductor thin film portion 21 by etching using photo lithography process. For example, when the metallic thin film 20 is used as the second electrode conductor thin film 17, the surrounding around the coupling conductor thin film portion 21, which is scheduled to be conductive with the first electrode conductor thin film 14, is etched into a donut shape so as to form the through hole 18 and the metallic thin film 20 left inside is employed as the first coupling conductor thin film portion 15a for the first electrode conductor thin film 14 (process A). On the other hand, when the metallic thin film 20 is used as the first electrode conductor thin film 14, the surrounding portion around the coupling conductor thin film portion 21, which is scheduled to be conductive with the second electrode conductor thin film 17, is etched into a donut shape so as to form the through hole 16 and the metallic thin film 20 left inside is employed as the first coupling conductor thin film portion 19a for the second electrode conductor thin film 17 (process B). The step 2 of FIG. 6 executes the process A.

Subsequently, the procedure proceeds to step 3, in which the dielectric thin film 13 is formed so as to cover entirely the second electrode conductor thin film 17 (the first electrode conductor thin film 14 in process B) after etching ends.

When the Sol-Gel processing method is employed, for example, a following process can be adopted. First, when alkoxide, which can be a raw material for high dielectric constant oxide for forming dielectric thin film, for example, barium titanate is used as main dielectric material, titanium isopropoxyde is dissolved in alcohol base organic solvent together with metallic barium. At this time, metallic barium reacts with alcohol base organic solvent and is dissolved in the form of barium alkoxide. In the meantime, when strontium titanate or lead titanate is mixed for adjustment of dielectric constant characteristic or the like, it is recommended to dissolve strontium normal butoxyd or lead tetraacetate in the solution. As the alcohol base organic solvent which is used as solvent, it is desirable to use a solvent using chelating plasticity, for example, a mixture solvent of ethanol and acetylacetone or 2-ethoxy ethanol or the like. Further, to adjust the viscosity of obtained solution, it is permissible to mix a small amount (less than an equivalent amount to alcohol base organic solvent) of water into the solution so that the respective metallic sources are polymerized appropriately. The solution obtained in the above-described manner is equalized by heating or the like and then applied in the form of film according to a well-known coating method such as spin coat method. After this is dried, it is baked at temperatures of 500° C. or more to 1000° C. or less so as to obtain a crystalline high dielectric constant thin film. Meanwhile, it is permissible to use sputtering or CVD method instead of the Sol-Gel processing method.

The donut-like gap between the through hole 18 (through hole 16 in process B) and the first coupling conductor thin film portion 15*a* (first coupling conductor thin film portion 19*a* in process B) is filled with material of the dielectric thin film 13 so that the dielectric in-hole charging portion 13*v* is formed. Although at this time, the coupling conductor thin film portion 15*a* (19*a*) on the inner side of the dielectric in-hole charging portion 13*v* is covered with the dielectric thin film 13 temporarily, it is exposed by forming the through hole 13*h* by photo lithography process (as etching solution, for example, hydrofluoric acid base aqueous solution can be used). To form the first coupling conductor thin film portion 15*a* (coupling conductor thin film portion 19*a* in process B) for the second electrode conductor thin film 17 (first electrode conductor thin film 14 in process B), the through hole 13*h* is formed at a corresponding position.

Figure 10:
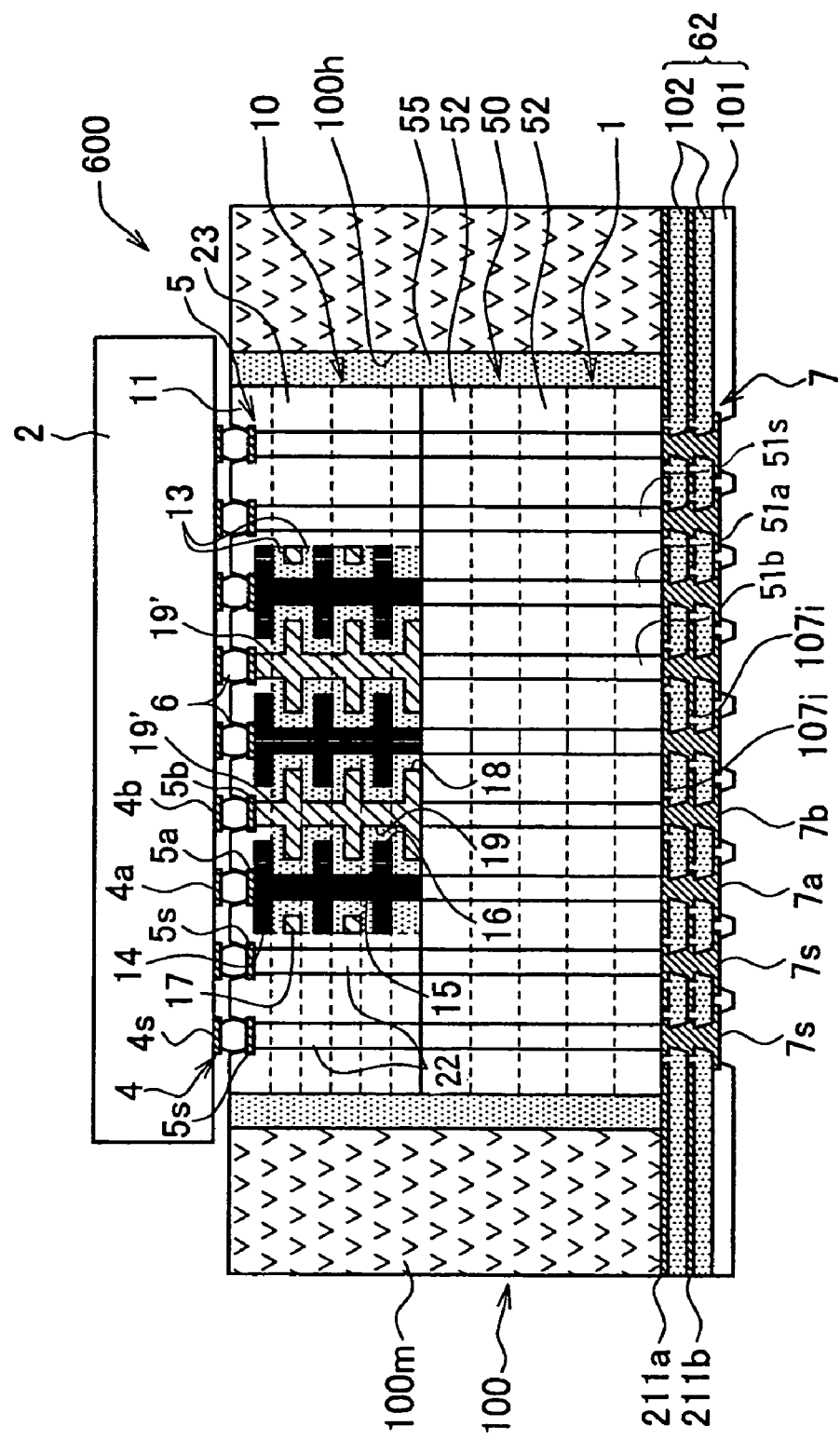
FIG. 10 is a schematic cross-sectional view of a fifth preferred embodiment.

Then, the same metallic thin film 20 as in step 1 is formed as shown in step 4. The through hole 13*h* formed in step 3 is filled with metal so that the second coupling conductor thin film portion 15*b* (19*b*) is formed and integrated with the first coupling conductor thin film portion 15*a* within the dielectric in-hole charging portion 13*v* to turn to the coupling conductor portion 15 (19). By returning to step 2 and repeating the following steps, as shown in step 5, the layers can be formed successively in conditions in which the first electrode conductor thin film 14 and the second electrode conductor thin film 17 are separated in terms of direct current (in step 4, the process A and the process B are repeated alternately). In FIG. 10, after the layering of the first electrode conductor thin film 14 and the second electrode conductor thin film 17 is completed, the signal coupling conductor 22 and the auxiliary dielectric layer 23 are layered in batch.

Hereinafter, various kinds of modifications of the intermediate substrates of the present invention will be described. Like reference numerals are attached to the same components of the intermediate substrate 200 in FIG. 4 in the following configuration and detailed description thereof is omitted. First, in the intermediate substrate 300 of FIG. 7, its subsidiary core accommodation portion 100*h* is formed in the form of a bottomed concave portion which is open to the first main surface of the core main body portion 100*m*. The second wiring layer portion 62 is formed such that it is in contact with the second main surface of the core main body portion 100*m* on the rear side of the concave portion. Because under this structure, the ceramic subsidiary core portion 1 is not exposed on the side of the second main surface of the core main body portion 100*m*, there is such an advantage that the flat second wiring layer portion 62 can be formed further easily. More specifically, bottom through hole conductor portions (209*a*, 209*b*), conductive with respective terminals constituting the second terminal array 7 such that they go through a portion constituting the bottom portion of the subsidiary core accommodation portion 100*h* of the core main body portion 100*m*, are formed and the respective subsidiary core conductors 51*a*, 51*b* formed in the ceramic subsidiary core portion 1 are conductive with the bottom through hole conductor portions (209*a*, 209*b*). Speaking more in detail, pads (80*a*, 80*b*) on the side of the bottom through hole conductor portions (209*a*, 209*b*) and pads (70*a*, 70*b*) on the side of the subsidiary core conductor are flip chip connected through the soldering connecting portion 6.

Figure 8:
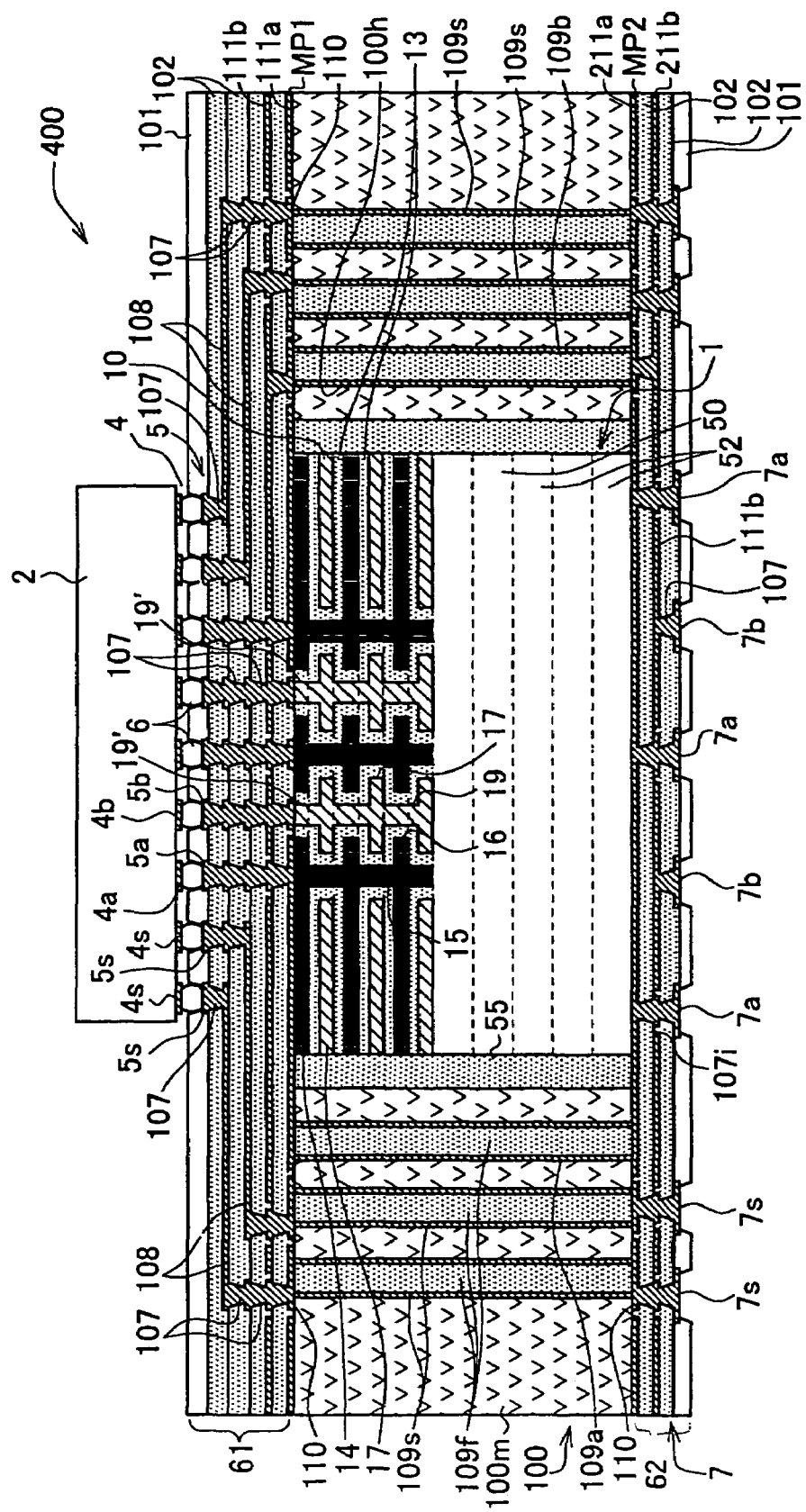
FIG. 8 is a schematic cross-sectional view of a third preferred embodiment.

Next, in an intermediate substrate 400 in FIG. 8, a first side first facial conductor 111*a* and a first side second facial conductor 111*b*, which are conductive with the first side first terminals 5*a* and the first side second terminals 5*b* of the first terminal array 5, are formed such that they cover the first main surface of the core main body portion 100*m* together with the ceramic subsidiary core portion 1 in the first wiring portion 61. The first side first facial conductor 111*a* and the first side second facial conductor 111*b* are conductive with a first through hole conductor 109*a* and a second through hole conductor 109*b* formed in the thickness direction of the core main body portion 100*m* such that they bypass the ceramic subsidiary core portion 1. With this structure, no subsidiary core conductor conductive with the first side first terminals 5*a* and the first side second terminals 5*b* is formed within the ceramic subsidiary core portion 1. Because with the above-described structure, the formed volume ratio of metallic subsidiary core conductor can be reduced although such conductive metal as Cu has a relatively large linear expansion coefficient, the average linear expansion coefficient of the entire ceramic subsidiary core portion 1 can be decreased and consequently, the reduction effect of the linear expansion coefficient difference between the semiconductor integrated circuit device 2 and the intermediate substrate 400 can be achieved remarkably. In the meantime, the first through hole conductor 109*a* and the second through hole conductor 109*b* are coupled to a second side first facial conductor 211*a* and a second side second facial conductor 211*b* within the second wiring layer portion 62 through the via conductor 107.

In this case, when in the first terminal array 5, as shown in FIG. 3, the first side first terminals 5*a* and the first side second terminals 5*b* are disposed within the array inside area and the first side signal terminals 5*s* are disposed in the array outside area, it is possible to provide a first side signal wiring 108 which introduces a signal transmission path out of the arrangement area of the ceramic subsidiary core portion 1, within the first wiring layer portion 61 such that it is conductive with the first side signal terminal 5*s* like in FIG. 4. The final end of the first side signal wiring 108 can be made conductive with the signal through hole conductor 109*s* formed in the thickness direction of the core main body portion 100*m* such that it bypasses the ceramic subsidiary core portion 1. Because with this structure, the plate-like base body 50 can be deprived of the subsidiary core conductor completely and can be constituted of ceramic solid plate, not only the reduction effect of the linear expansion coefficient difference between the semiconductor integrated circuit device 2 and the intermediate substrate 400 can be improved, but also the manufacturing process of the ceramic subsidiary core portion 1 can be simplified largely.

Figure 7:
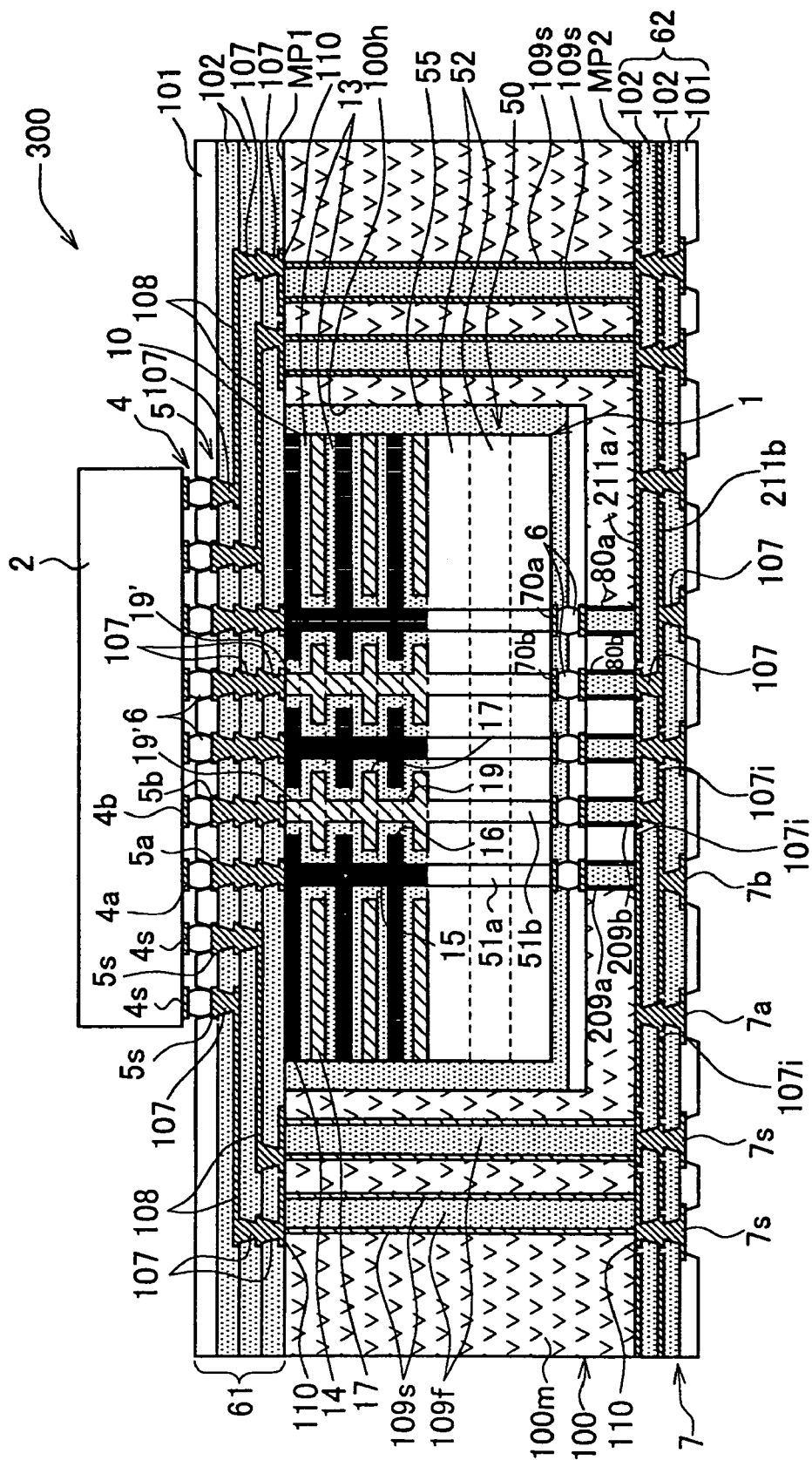
FIG. 7 is a schematic cross-sectional view of a second preferred embodiment of the intermediate substrate of the present invention.
Figure 9:
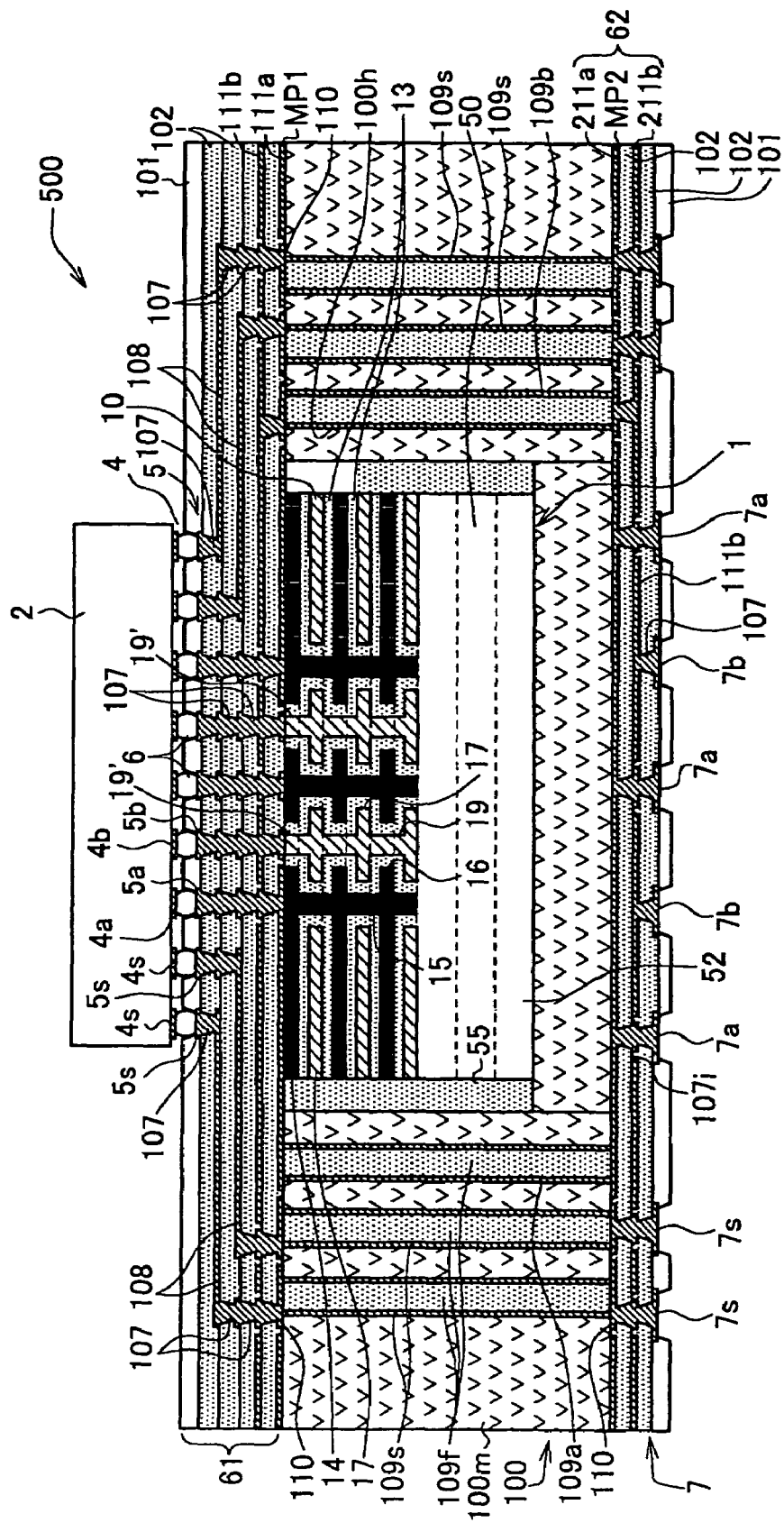
FIG. 9 is a schematic cross-sectional view of a fourth preferred embodiment.

The intermediate substrate 500 in FIG. 9 indicates an example in which the intermediate substrate 400 of FIG. 8 is so structured that the subsidiary core accommodation portion 100*h* is a bottomed concave portion, which is open to the first main surface of the core main body portion 100*m* like the intermediate substrate 300 of FIG. 7. Here, no subsidiary core conductor is formed in the plate-like base body 50 and therefore, no bottom through hole conductor portion 209 is formed at a portion which constitutes the bottom portion of the subsidiary core accommodation portion 100*h*.

Next, in the intermediate substrate 600 of FIG. 10, the first side first terminals 5*a* and the first side second terminals 5*b* constituting the first terminal array 5 are constructed such that they are exposed on the first main surface of the ceramic subsidiary core portion 1. Further, the first subsidiary core conductor 51*a* and the second subsidiary core conductor 51*b*, which correspond to the first side first terminals 5*a* and the first side second terminals 5b of the first terminal array 5 and are conductive with the second side first terminals 7a and the second side second terminals 7b of the second terminal array 7, are formed in the thickness direction of the ceramic subsidiary core portion 1. With this structure, the first wiring layer portion 61 composed of mainly polymer material is excluded from the first main surface of the ceramic subsidiary core portion 1 and the semiconductor integrated circuit device 2 and the ceramic subsidiary core portion 1 are connected directly through the soldered connecting portion 6. Consequently, the reduction effect of the linear expansion coefficient difference between the semiconductor integrated circuit device 2 and the intermediate substrate 600 is improved further. Further because no wiring conductive with any terminal is placed just above the ceramic subsidiary core portion 1, lower inductance and further lower impedance in the thin film capacitor portion 10 created in the uppermost surface layer portion can be achieved. In the meantime, in the intermediate substrate 600 of this embodiment, no first side wring layer portion is formed.

In the intermediate substrate 600 of FIG. 10, the first side signal terminals 5s constituting the first terminal array 5 are formed such that they are exposed on the first main surface of the ceramic subsidiary core portion 1. The signal subsidiary core conductors 51s, which correspond to the first side signal terminals 5s and are conductive with the second side signal terminal 7s of the second terminal array 7, are formed in the thickness direction of the ceramic subsidiary core portion 1. Because this structure can be adopted in case where the distance between terminals in the first terminal array 5 is not so small and the subsidiary core conductor 51s can be formed to the signal terminal also, lower inductance and further lower impedance in not only transmission path for ground and power supply but also in a signal transmission path can be achieved.

The signal terminal 5s is connected to the signal subsidiary core conductor 51s within the plate-like base body 50 through the signal coupling conductor portion 22 in the thin film capacitor portion 10 in conditions in which it is not conductive with the electrode conductor thin films 14, 17 within the thin film capacitor portion 10. The dielectric layer (hereinafter referred to as auxiliary dielectric layer) 23 covering the signal coupling conductor portion 22 within the thin film capacitor portion 10 is formed of material having lower dielectric constant (for example, silicon dioxide according to this embodiment) than the dielectric layer 13 covering the electrode conductor thin films 14, 17. Consequently, coupling in terms of the capacity between the signal coupling conductor portion 22 and the electrode conductor thin films 14, 17 is suppressed.

Figure 11:
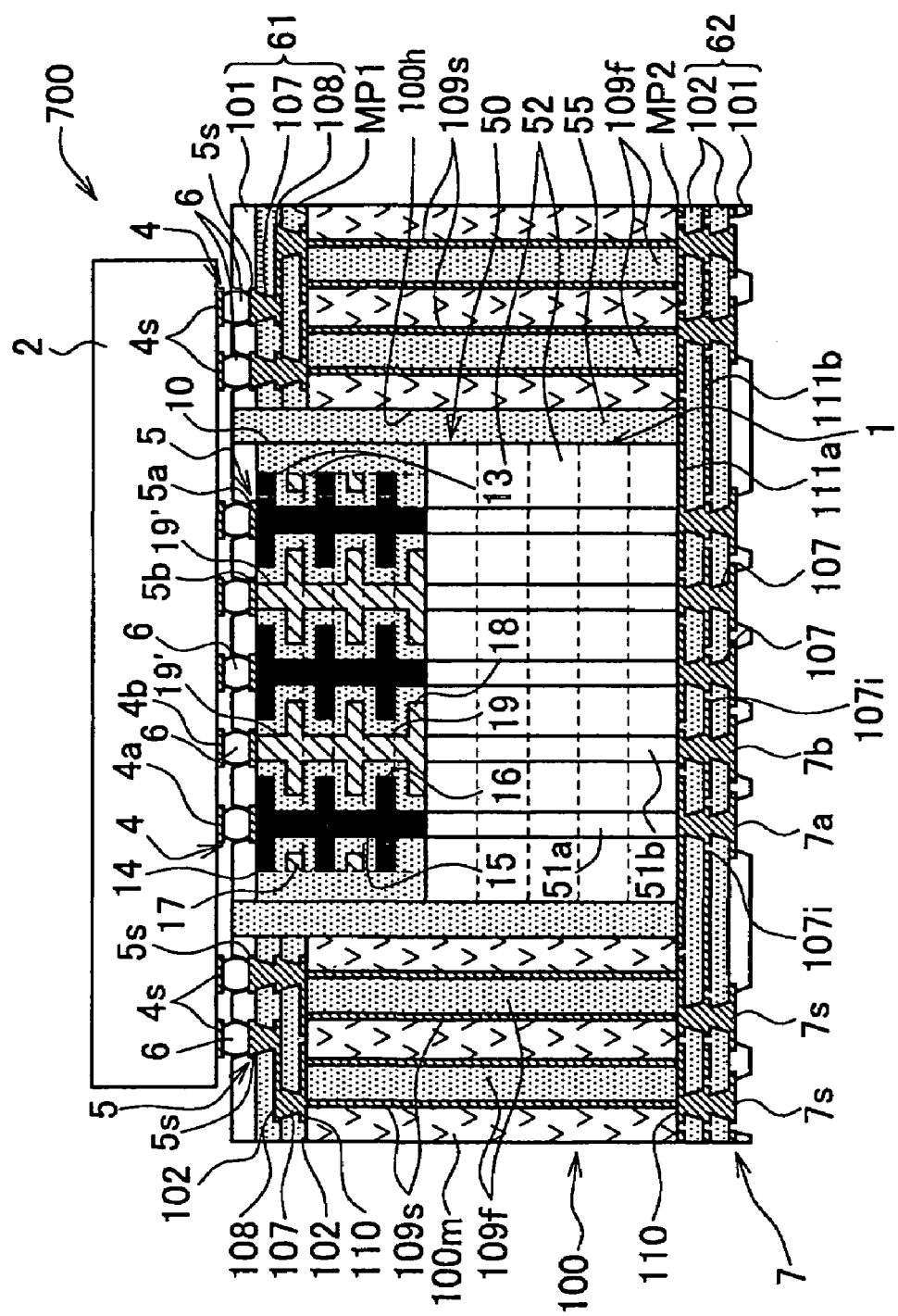
FIG. 11 is a schematic cross-sectional view of a sixth preferred embodiment.

On the other hand, outside the subsidiary core accommodation portion 100h of the intermediate substrate 700 of FIG. 11, only the first main surface of the core main body portion 100m is covered with the dielectric layer 102 composed of molecular material and the first wiring layer portion 61 in which conductive layers including facial conductors for wiring, ground and power supply are layered alternately. The first side signal terminals 5s are formed such that they are exposed on the surface of the first wiring layer portion 61. On the other hand, the first side first terminals 5a and the first side second terminals 5b are formed such that they are exposed on the first main surface of the ceramic subsidiary core portion 1 like in FIG. 10. Then, the first side signal wiring 108 which introduces a signal transmission path out of the arrangement area of the ceramic subsidiary core portion 1, is provided within the first wiring layer portion 61 such that it is conductive with the first side signal terminals 5s. The final end of the first side signal wiring 108 is conductive with the signal through hole conductor 109s formed in the thickness direction of the core main body portion 100m such that it bypasses the ceramic subsidiary core portion 1. Because this configuration is capable of introducing wiring conductive with a signal terminal on the outer periphery of the array in an outward direction on in-plane largely, it can be said to be advantageous in case where the distance between terminals of the first terminal array 5 is small.

Figure 12:
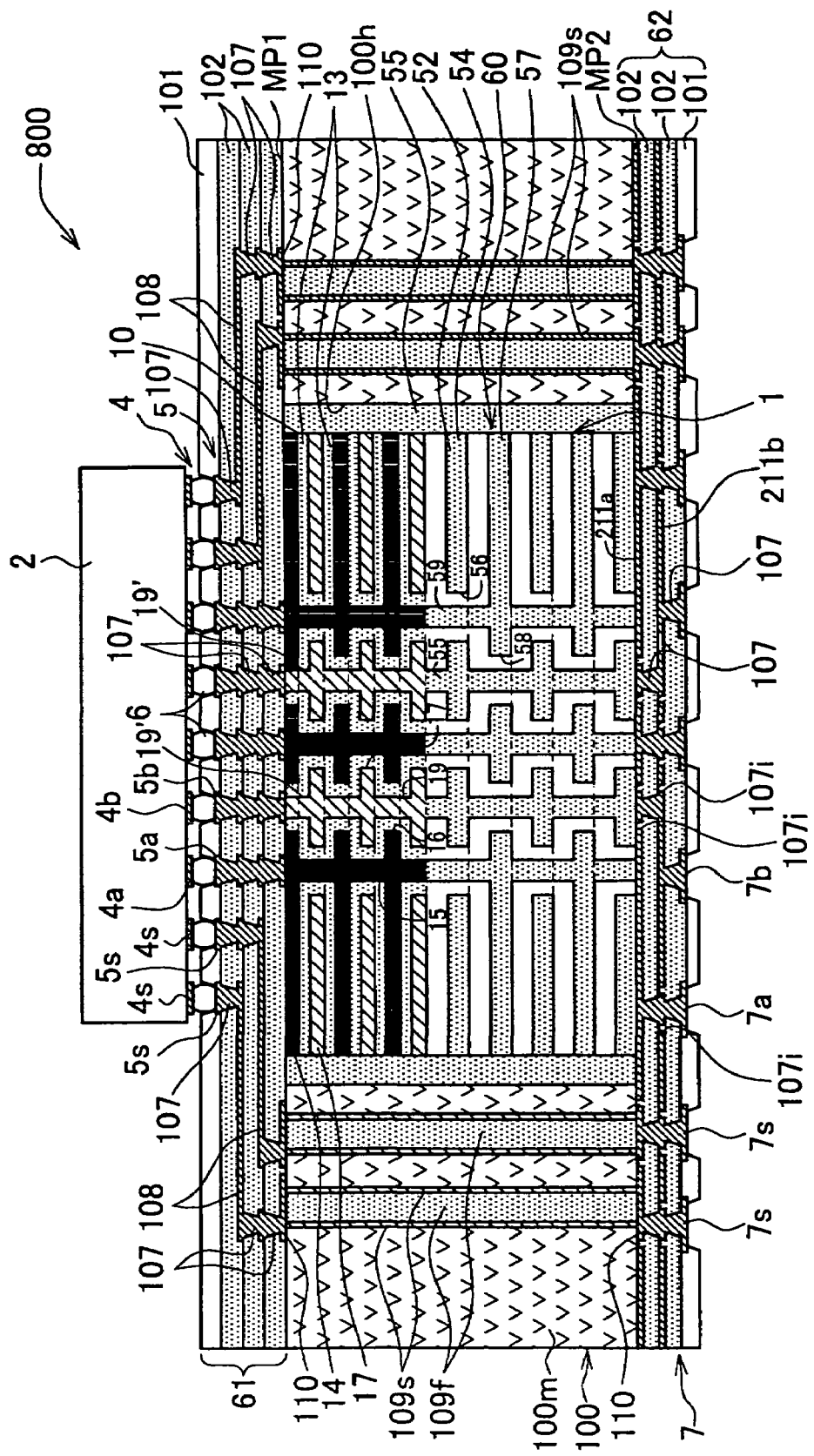
FIG. 12 is a schematic cross-sectional view of a seventh preferred embodiment.

In any embodiments described above of the intermediate substrates, the plate-like base body can be composed as a layered ceramic capacitor. An intermediate substrate 800 of FIG. 12 is an example in which the plate-like base body 50 of the wiring substrate 200 of FIG. 4 is replaced with a layered ceramic capacitor 60. The plate-like base body 60 of the intermediate substrate 800 is constituted of a baked layered ceramic capacitor in which a first baked electrode conductor layer 57 conductive with the first subsidiary core conductor 59, a second baked electrode conductor layer 54 conductive with a second subsidiary core conductor 55, and a baked ceramic dielectric layer 52, which is baked together with the first baked electrode conductor layer 57 and the second baked electrode conductor layer 54 at the same time, are layered alternately. The ceramic plate-like base body 60 constituted of such layered ceramic capacitor can be manufactured using the ceramic green sheet like in FIG. 4 and the baked electrode conductor layers 57, 54 can be formed by coating with metallic paste by printing. The electrode conductor layers 57 or 54 having the same polarity are coupled in the layering direction through the subsidiary core conductors 59, 55 acting as via hole and the electrode conductor layers 57, 54 and the subsidiary core conductors 59, 55 each having a different polarity are separated in terms of direct current by the through holes 58, 56 formed in the respective electrode conductor layers 59, 55 when a metallic paste pattern is printed.

From viewpoint of increased capacity, the dielectric layer 52 for use in the layered ceramic capacitor 60 is preferred to be composed of a high dielectric constant ceramic (the aforementioned Perovskite type). On the other hand, when it is desired to set the electrostatic capacity of the layered ceramic capacitor 60 to a positively small value in order to expand a band toward lower impedance to the side of high frequency, the dielectric layer 52 for use in the layered ceramic capacitor 60 can be constituted of always dielectric ceramic such as alumina and glass ceramic.

Although in the capacitor of the present invention disclosed by the above-described embodiments, the thin film capacitor portion 10 is constituted of plural layers of each of the first electrode conductor thin films and the second electrode conductor thin films, it is permissible to form a thin film capacitor portion constituted of only a single layer of each of the first electrode conductor thin film and the second electrode conductor thin film.

Although the electrode conductor thin films 14, 17 look separated in in-plane direction by accompanied representation of the through hole 16, actually, as shown in FIG. 5, continuous thin film is formed in in-plane direction at other portions than the through holes 16, 18. The same thing can be said of the dielectric thin film 13. This structure is the same as in the electrode conductor layers 14, 17 of the baked type capacitor (layered capacitor built in the subsidiary core portion) of the intermediate substrates shown in FIGS. 13–19 and the ceramic layer 52.

Figure 13:
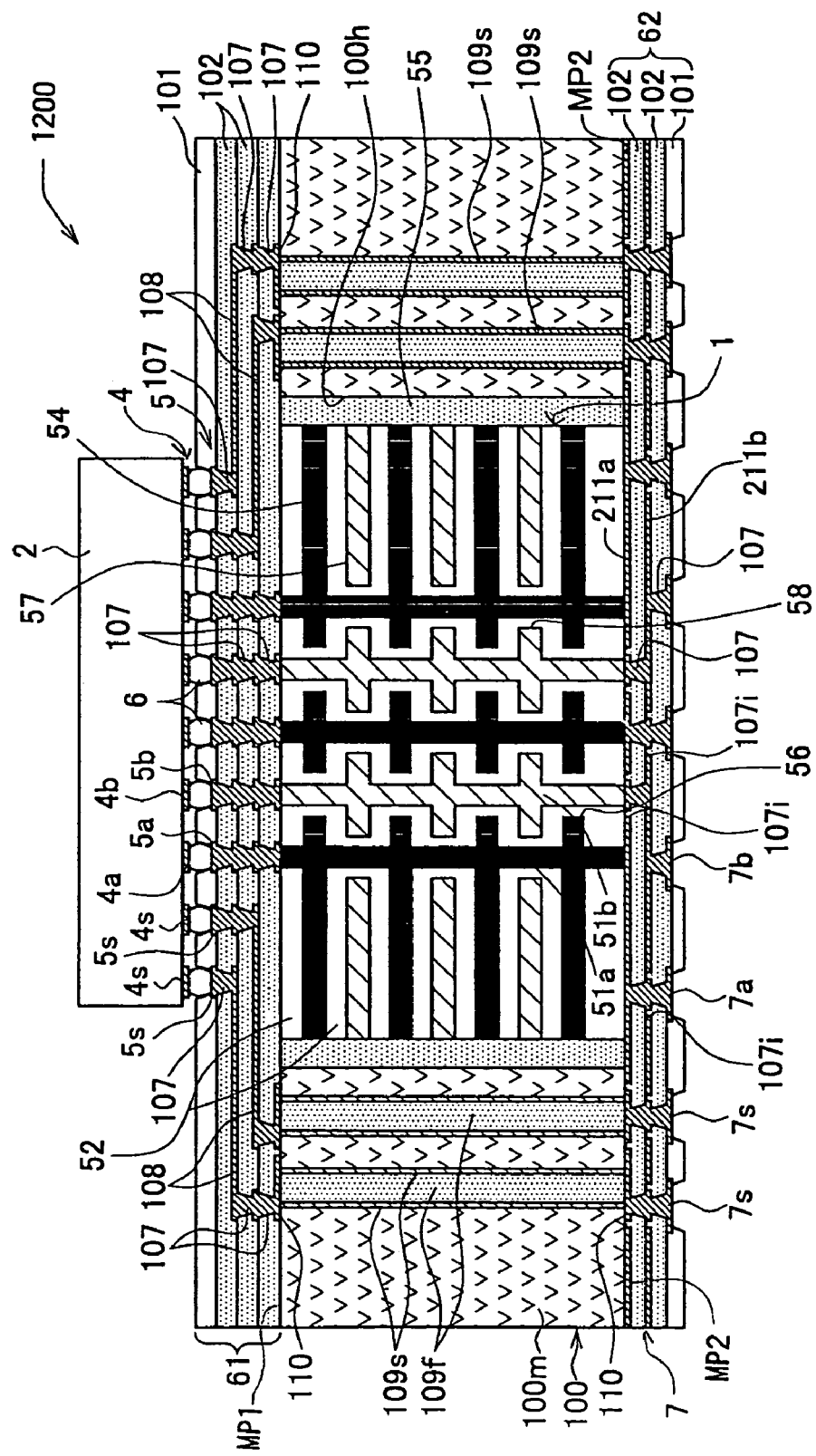
FIG. 13 is a schematic cross-sectional view of an intermediate substrate of the present invention.
Figure 14:
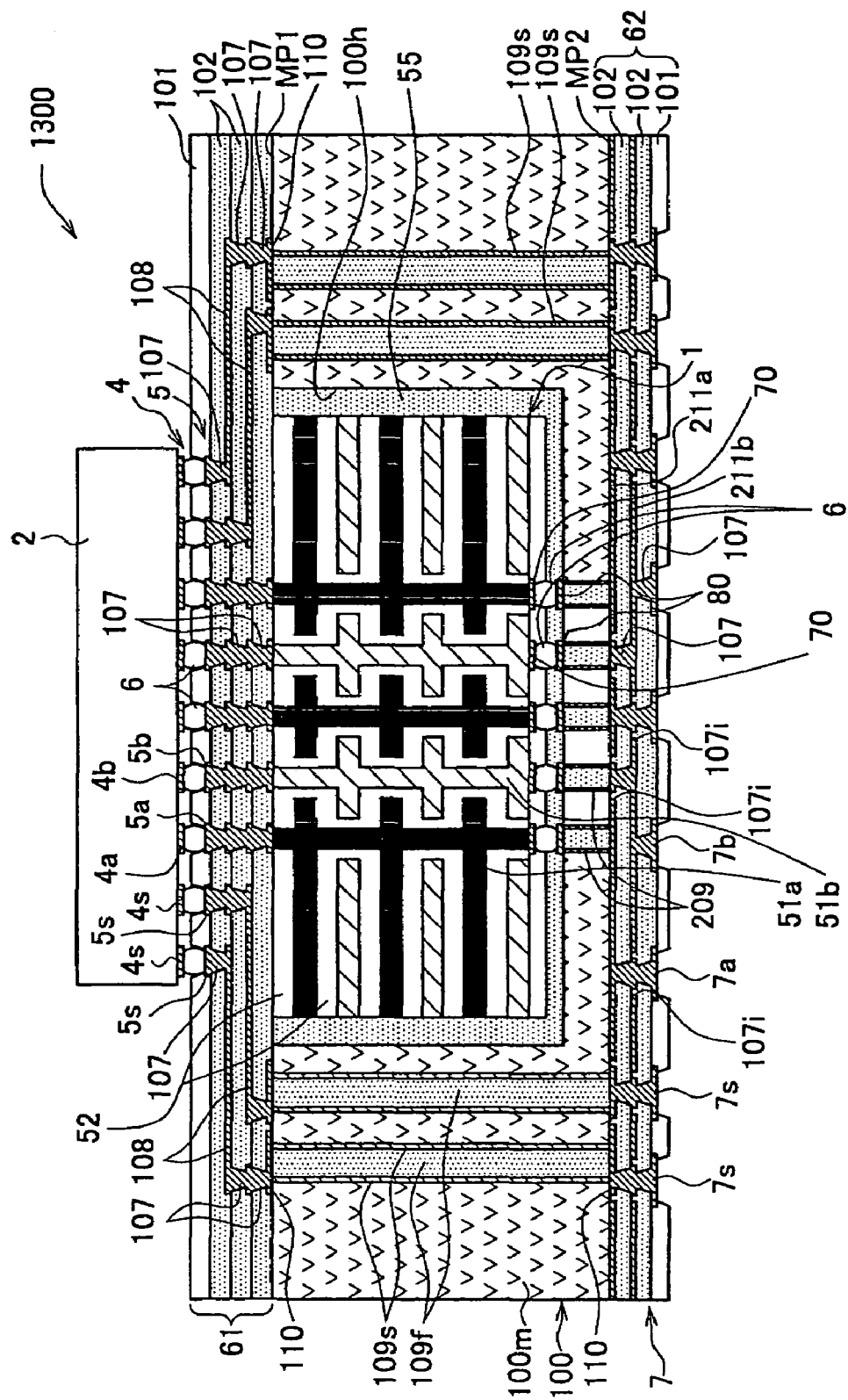
FIG. 14 is a schematic cross-sectional view of a further intermediate substrate of the present invention.

As shown in FIG. 13, an intermediate substrate 1200 includes a substrate core 100, which is comprised of a core main body portion 100m in which a subsidiary core accommodation portion 100h is opened in the first main surface so as to reduce the thickness thereof and a ceramic subsidiary core portion 1 which is composed of ceramic in the form of a sheet and accommodated in the subsidiary core accommodation portion 100h such that it matches the core main body portion 100m in the thickness direction. On the first main surface side of the substrate core 100, the first side first terminals 5a and the first side second terminals 5b, the ones of which function as power terminals while the others function as ground terminals and a first terminal array 5 composed of first side signal terminals 5s are formed.

The first terminal array 5 is formed at a position in which when it is projected orthogonally to a reference plane parallel to the sheet face of the substrate core 100, its entire projection is included within the projection area of the ceramic subsidiary core portion 1. That is, all the first side first terminals 5a, the first side second terminals 5b and the first side signal terminals 5s are flip chip connected to the semiconductor integrated circuit device 2 (device side terminal array 4 thereof on the ceramic subsidiary core portion 1. Consequently, the difference in linear expansion coefficient between the semiconductor integrated circuit device 2 and all the terminals in the first terminal array 5 can be reduced sufficiently so that wiring break or the like due to thermal stress can become unlikely to occur. In the intermediate substrate 1200 of FIG. 13, the ceramic subsidiary core portion 1 has a larger area than the formation area of the first terminal array 5, so that its thermal stress reduction effect is raised further.

According to this embodiment, the entire ceramic subsidiary core portion 1 is constructed as a layered ceramic capacitor. In the layered ceramic capacitor, the first electrode conductor layer 54 conductive with the first side first terminals 5a and the second side first terminals 7a, the ceramic layer 52 composed of dielectric layer and the second electrode conductor layer 57 conductive with the first side second terminals 5b and the second side second terminals 7b are layered periodically in this order.

Figure 2:
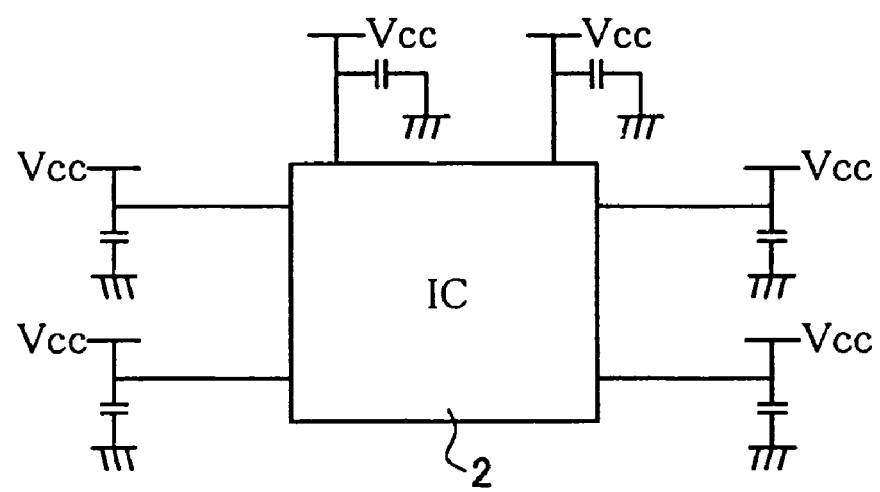
FIG. 2 is an equivalent circuit diagram of a decoupling capacitor for integrated circuit.

More specifically, the ceramic subsidiary core portion 1 in FIG. 13 is a baked layered ceramic capacitor in which the first baked electrode conductor layer 54 conductive with the first subsidiary core conductor 51a, the second baked electrode conductor layer 57 conductive with the second subsidiary core conductor 51b and the baked ceramic dielectric layer 52 which is baked together with the first baked electrode conductor layer 54 and the second baked electrode conductor layer 57 at the same time are layered alternately. The ceramic subsidiary core portion 1 composed of such a layered ceramic capacitor can be manufactured using ceramic green sheets and the baked electrode conductor layers 54, 57 can be formed by coating with metallic paste by printing. The electrode conductor layers 54, 57 having the same polarity are coupled in the layering direction by the subsidiary core conductors 51a, 51b acting as via hole and the electrode conductor layers 54, 57 and the subsidiary core conductors 51a, 51b each having a different polarity are separated in terms of direct current by the through holes 56, 58 formed in the respective electrode conductor layers 54, 57 when a metallic paste pattern is printed. As shown in FIG. 2, the capacitor functions as a decoupling capacitor connected in parallel to the power supply line of the semiconductor integrated circuit device 2.

Next on the second main surface side of the substrate core 100, the second terminal array 7b comprising the second side first terminals 7a and the second side second terminals 7b, conductive with the first side first terminals 5a and the first side second terminals 5b and the second side signal terminals 7s conductive with the first side signal terminals 5s is formed. Then, the first terminal array 5 is formed at a position in which when it is projected orthogonally to a reference plane parallel to the sheet face of the substrate core 100 (for example, which can be set in the first main surface MP of the substrate core 100), its projected image is entirely included within the projection area of the ceramic subsidiary core portion 1. The charged coupling layer 55 composed of polymer material is formed in a space produced by a gap between the ceramic subsidiary core portion 1 and the core main body portion 100m within the subsidiary core accommodation portion 100h. This charged coupling layer 55 fixes the ceramic subsidiary core portion 1 to the core main body portion 100m and takes a role for absorbing a difference in linear expansion coefficient in in-plane direction and thickness direction between the ceramic subsidiary core portion 1 and the core main body portion 100m with its own elastic deformation.

In the first terminal array 5 of the intermediate substrate 1200 like the intermediate substrate 200, as shown in FIG. 3, the first side first terminals 5a and the first side second terminals 5b are arranged in a grid configuration shifted alternately (or staggered configuration is accepted). Likewise, in the second terminal array 7 also, the second side first terminals 7a and the second side second terminals 7b are arranged in the grid configuration shifted alternately (or the staggered configuration is accepted) corresponding to the terminal arrangement of the first terminal array 5. In the meantime, any of the arrays 5, 7 has plural first side signal terminals 5a and second side signal terminals 7s such that they surround the power terminals and ground terminals in the grid configuration.

In FIG. 13, the first subsidiary core conductor 51a and the second subsidiary core conductor 51b, which correspond to the first side first terminals 5a and the first side second terminals 5b of the first terminal array 5 and are conductive with the second side first terminals 7a and the second side second terminals 7b of the second terminal array 7, are formed in the thickness direction of the ceramic subsidiary core portion 1. The first subsidiary core conductor 51a and the second subsidiary core conductor 51b are conductive with the first side first terminals 5a and the first side second terminals 5b through the via conductor 107 formed through the respective dielectric layer 102 of the first wiring layer portion 61. By forming the conductors 51a, 51b for ground and power supply within the ceramic subsidiary core portion 1, lower inductance and lower impedance in the path for ground and power supply can be achieved. In the meantime, the first subsidiary core conductor 51a and the second subsidiary core conductor 51b are coupled with the second side first facial conductor 211a and the second side second facial conductor 211b within the second wiring layer portion 62 through the via conductor 107. Further, the second side first terminals 7a and the second side second terminals 7b of the second terminal array 7 are connected to these second side first facial conductor 211a and the second side second facial conductor 211b.

In the above-described ceramic subsidiary core portion 1, by overlaying the well-known ceramic green sheets containing raw material powder of composition ceramic and metallic powder paste charged in the via holes formed by punching or laser boring, the aforementioned subsidiary core conductors 51a, 51b (further 51s mentioned later) are formed as layered via holes.

Hereinafter, various modifications of the intermediate substrates of the present invention will be described. Like reference numerals are attached to components constructed in the same manner as the intermediate substrate 1200 of FIG. 13 and detailed description thereof is omitted. First, the intermediate substrate 1300 is equal to the intermediate substrate 300 of FIG. 7 except the structure of the ceramic subsidiary core portion 1. The subsidiary core accommodation portion 100h is constructed as a bottomed concave portion which is open to the first main surface of the core main body portion 100m. The second wiring layer portion 62 is formed in contact with the second main surface of the core main body portion 100m on the rear side of the concave portion. This structure has such an advantage that the flat second wiring layer portion 62 can be formed more easily because the ceramic subsidiary core portion 1 is not exposed on the side of the second main surface of the core main body portion 100m. More specifically, the bottom through hole conductor portion 209 conductive with respective terminals which constitute the second terminal array 7 such that they go through a portion acting as the bottom of the subsidiary core accommodation portion 100h of the core main body portion 100m, is formed, so that the respective subsidiary core conductors 51a, 51b formed in the ceramic subsidiary core portion 1 are conductive with the bottom through hole conductor portion 209. More specifically, a pad 80 on the side of the bottom through hole conductor portion 209 and a pad 70 on the side of the subsidiary core conductor are flip chip connected to each other through the soldered connecting portion 6.

Figure 15:
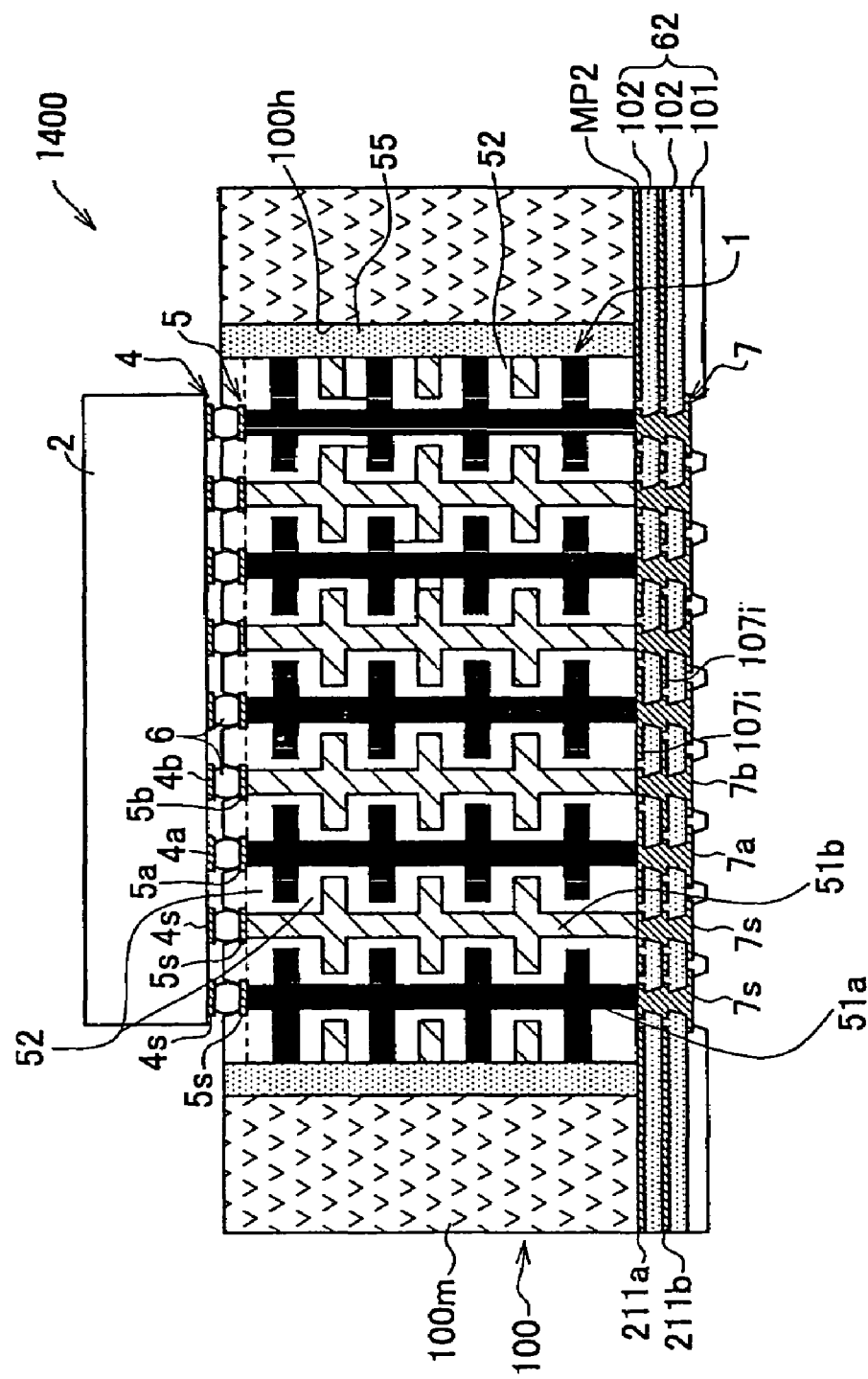
FIG. 15 is a schematic cross-sectional view of yet another intermediate substrate of the present invention.

Next, the intermediate substrate 1400 of FIG. 15 is the same as the intermediate substrate 400 of FIG. 8 except the structure of the ceramic subsidiary core portion 1. That is, the first side first terminals 5a and the first side second terminals 5b which constitute the first terminal array 5 are formed such that they are exposed on the first main surface of the ceramic subsidiary core portion 1. Further, the first subsidiary core conductor 51a and the second subsidiary core conductor 51b, which correspond to the first side first terminals 5a and the first side second terminals 5b of the first terminal array 5 and are conductive with each of the second side first terminals 7a and the second side second terminals 7b of the second terminal array 7, are formed in the thickness direction of the ceramic subsidiary core portion 1. With this structure, the first wiring layer portion 61 is excluded from the first main surface of the ceramic subsidiary core portion 1 and the semiconductor integrated circuit device 2 and the ceramic subsidiary core portion 1 are connected directly through the soldered connecting portion 6. Consequently, the reduction effect of the difference in linear expansion coefficient between the semiconductor integrated circuit device 2 and the intermediate substrate 1400 is improved. Further, because no wiring conductive with any terminal is placed just above the ceramic subsidiary core portion 1, lower inductance and lower impedance in the transmission path conductive with the terminal can be achieved. In the meantime, in the intermediate substrate 1400 of this embodiment, the first side wiring layer portion is not formed.

Figure 16:
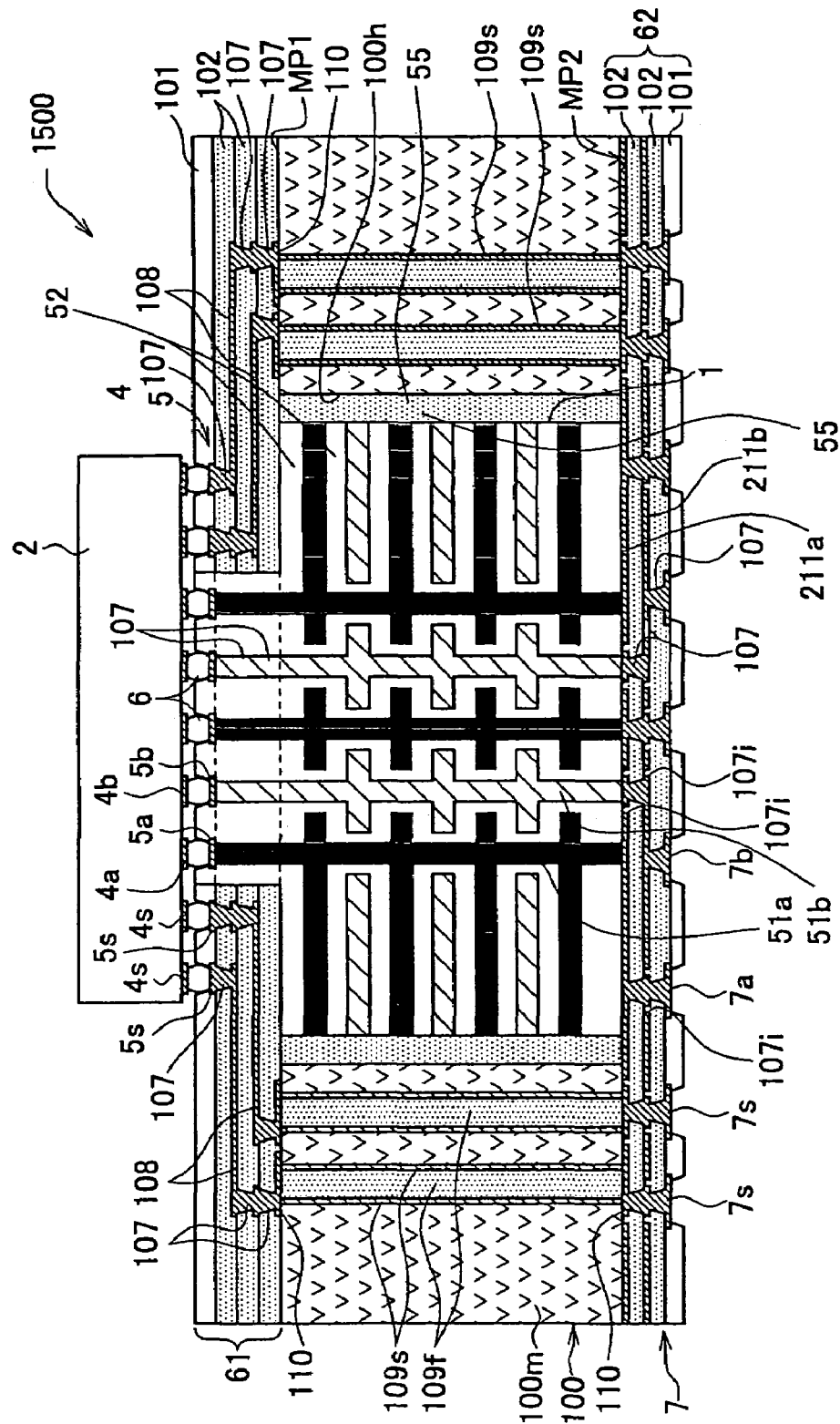
FIG. 16 is a schematic cross-sectional view of another intermediate substrate of the present invention.
Figure 17:
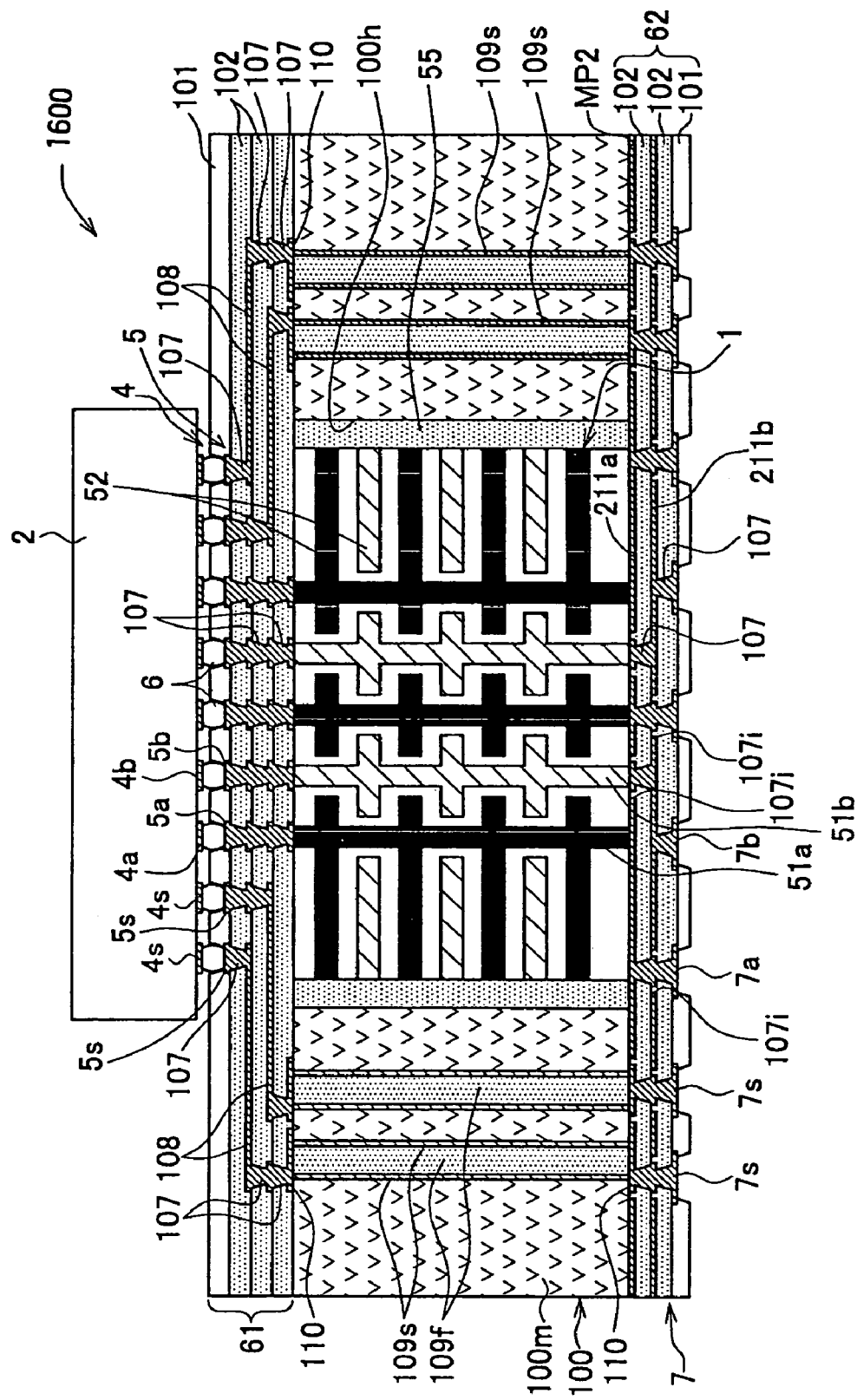
FIG. 17 is a schematic cross-sectional view of a further intermediate substrate of the present invention.
Figure 18:
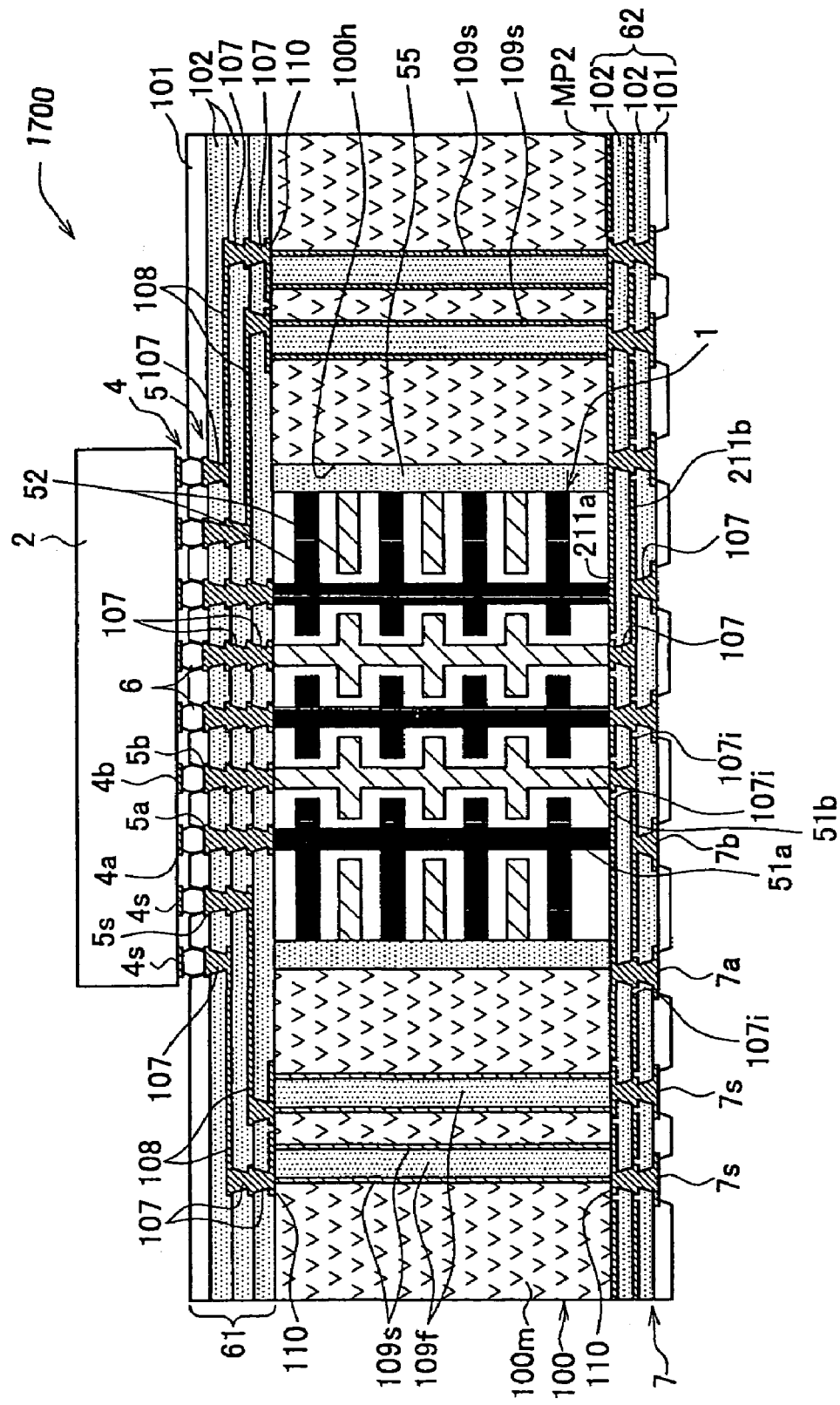
FIG. 18 is a schematic cross-sectional view of another intermediate substrate of the present invention.

On the other hand, the intermediate substrate 1500 of FIG. 16 is the same as the intermediate substrate 700 of FIG. 11 except the structure of the ceramic subsidiary core portion 1. That is the outer peripheral portion of the first main surface of the ceramic subsidiary core portion 1 is covered with the first wiring layer portion 61 in which the dielectric layer 102 composed of polymer material and conductive layer including a facial conductor for wiring, ground or power supply are layered alternately, together with the first main surface of the core main body portion 100m. The first side signal terminals 5s is formed such that it is exposed on the surface of the first wiring layer portion 61. Then, the first side signal wiring 108 for introducing a signal transmission path out of the arrangement area of the ceramic subsidiary core portion 1 is provided within the first wiring layer portion 61 such that it is conductive with the first side signal terminals 5s. The final end of the first side signal wiring 108 is conductive with the signal through hole conductor 109s formed in the thickness direction of the core main body 100m such that it bypasses the ceramic subsidiary core portion 1. It can be said that this structure is advantageous when the distance between terminals in the first terminal array 5 is small because the wiring conductive with the signal terminal at the outer peripheral portion of the array can be introduced largely in in-plane direction.

Although, according to any of the above described embodiments, the subsidiary core portions 1 is formed with an area larger than the semiconductor integrated circuit device 1, the subsidiary core portion 1 can be formed with substantially the same area as the projection area of the semiconductor integrated circuit device 1. Further, the subsidiary core portion 1 can be constructed in a smaller area than the semiconductor integrated circuit device 1 while all the first terminal array 5 is accommodated in the area of the subsidiary core portion 1. When there is not so much fear on connecting condition of the soldered connecting portion 6 at a terminal located more on the outer periphery of the semiconductor integrated circuit device 1, the subsidiary core portion 1 can be constructed with a smaller area than the first terminal array 5 like the intermediate substrate 1700 of FIG. 18.

Figure 19:
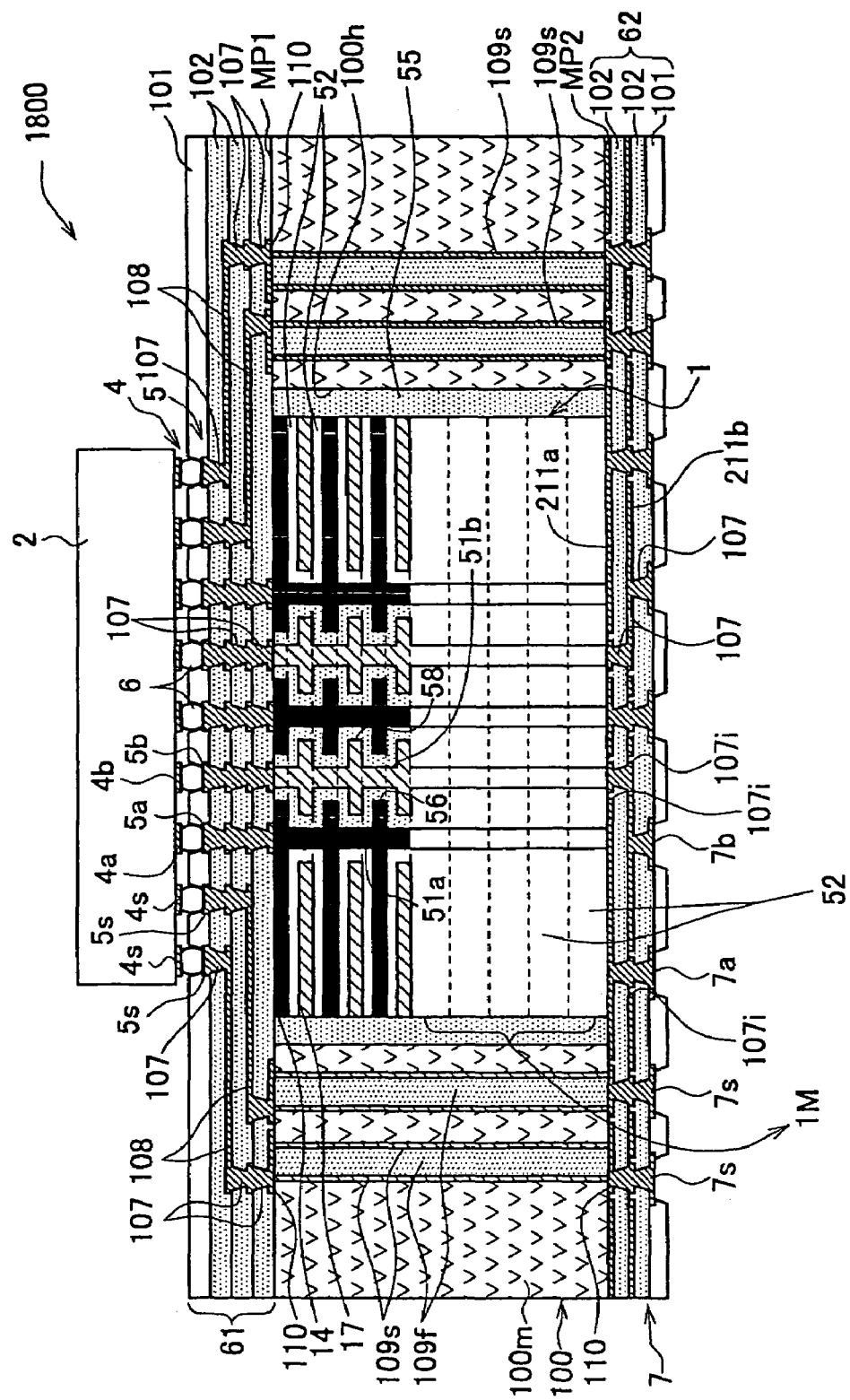
FIG. 19 is a schematic cross-sectional view of a further intermediate substrate of the present invention.

The intermediate substrate 1800 of FIG. 19 is an example that a capacitor is formed using only the partial ceramic layer 52 contained in the subsidiary core portion 1 and remaining ceramic layer 52 is employed as a subsidiary core main body 1M containing no capacitor.

Although the invention has been described above in relation to preferred embodiments thereof, it will be understood by those skilled in the art that variations and modifications can be effected in these preferred embodiments without departing from the scope and spirit of the invention.

What is claimed is:

1. An intermediate substrate comprising:
   a substrate core comprising a main core body portion constructed of a sheet of polymer material and including a subsidiary core accommodation portion opening at a first main surface of the main core body portion as to reduce the overall transverse thickness thereof n the region of said subsidiary core accommodation portion, and a ceramic subsidiary core portion, accommodated in said subsidiary core accommodation portion and of a thickness which, together with the transverse thickness of any remaining portion of said main core body portion in said region, matches the overall transverse thickness of said main core body portion;
   a first terminal array formed on a first main surface side of said substrate core and comprising first side first terminals and first side second terminals some of which function as power terminals and others of which function as ground terminals, said first terminal array further comprising first side signal terminals; and
   a second terminal array formed on a second main surface side of said substrate core and comprising second side first terminals and second side second terminals which are conductively connected to said first side first terminals and said first side second terminals, respectively, and second side signal terminals conductively connected to said first side signal terminals;

said ceramic subsidiary core portion comprising a substantially planar base body and a multilayered thin film capacitor portion formed on the first main surface side of the base body and comprising a first conductive thin film electrode and a second conductive thin film electrode separated from said first electrode by a thin film dielectric layer so as to prevent direct current flow between said electrodes, said first side first terminals and said first side second terminals of said first terminal array being conductively connected to said first electrode and said second electrode, respectively, such that direct current flow between said first side first terminals and said first side second terminals is prevented.

2. The intermediate substrate according to claim 1 wherein on the first main surface side of said thin film capacitor portion, said first side first terminals and said first side second terminals each comprise a plurality of terminals disposed at a predetermined interval, and the first side first terminals and the first side second terminals are electrically coupled to said first thin film electrode and said second thin film electrode, respectively, located nearest to said first main surface, either directly or through auxiliary coupling conductor portions.

3. The intermediate substrate according to claim 1 wherein said dielectric thin film layer is constructed of a high dielectric constant ceramic.

4. The intermediate substrate according to claim 3 wherein said base body is thicker than said thin film capacitor portion and comprises a ceramic material having a lower linear expansion coefficient than said high dielectric constant ceramic.

5. The intermediate substrate according to claim 4 wherein said base body comprises a ceramic material having a higher Young's modulus than said high dielectric constant ceramic.

6. The intermediate substrate according to claim 1 wherein said base body comprises a layered ceramic capacitor base body comprising alternate layers comprising at least one baked ceramic dielectric layer and at least one electrode conductor layer baked together with the baked ceramic dielectric layer.

7. The intermediate substrate according to claim 1 wherein said first terminal array is formed at a position at which, when said first terminal array is geometrically projected orthogonally to a reference plane parallel to a planar face of said substrate core, a resultant projection image of said first terminal array is entirely included in a corresponding geometrically projected area of said ceramic subsidiary core portion.

8. The intermediate substrate according to claim 7 wherein said ceramic subsidiary core portion is of an area at least equal to a corresponding area encompassed by said first terminal array.

9. The intermediate substrate according to claim 1 wherein, in said substrate core, the first main surface of said ceramic subsidiary core portion and the first main surface of said main core body portion are covered by a first wiring layer portion comprising alternate layers comprising a dielectric layer comprised of a polymer material and a conductive layer including a surface conductor for serving a wiring, ground or power supply function, and wherein said first terminal array is exposed on a first main surface of the first wiring layer portion.

10. The intermediate substrate according to claim 9 wherein a first side first surface conductor and a first side second surface conductor, which are respectively conductively connected to said first side first terminals and first side second terminals of said first terminal array, cover the first main surface of said main core body portion, together with said ceramic subsidiary core portion, within said first wiring layer portion; and a first side first surface conductor and a first side second surface conductor are conductively connected, respectively, to a first through hole conductor and a second through hole conductor each of which extends transversely of said main core body portion so as to bypass said ceramic subsidiary core portion.

11. The intermediate substrate according to claim 8 wherein, in said first terminal array, said first side first terminals and first side second terminals are disposed within an inside array area and said first side signal terminals are disposed within an outside array area, wherein said substrate further comprises a first side signal wiring, which provides a signal transmission path outside of said ceramic subsidiary core portion, is disposed within said first wiring layer portion so as to be conductively connected to said first side signal terminals, and wherein a terminal end of the first side signal wiring is conductively connected to a signal through hole conductor which extends transversely of said main core body portion and which bypasses said ceramic subsidiary core portion.

12. The intermediate substrate according to claim 11 wherein said first thin film electrode and said second thin film electrode of said thin film capacitor portion are disposed inwardly of said first side signal terminals.

13. The intermediate substrate according to claim 9 wherein a first subsidiary core conductor and a second subsidiary core conductor, which respectively correspond to said first side first terminals and first side second terminals of said first terminal array and which are respectively conductively connected to said second side first terminals and second side second terminals of said second terminal array, extend transversely of said ceramic subsidiary core portion, and the first subsidiary core conductor and the second subsidiary core conductor are conductively connected to said first side first terminals and first side second terminals through via conductors extending through each said dielectric layer of said first wiring layer portion.

14. The intermediate substrate according to claim 1 wherein said first side first terminals and said first side second terminals, which constitute said first terminal array, are exposed on the first main surface of said ceramic subsidiary core portion and a first subsidiary core conductor and a second subsidiary core conductor, which correspond to said first side first terminals and first side second terminals of said first terminal array and are conductively connected to said second side first terminals and second side second terminals of said second terminal array, extend transversely of the ceramic subsidiary core portion.

15. The intermediate substrate according to claim 14 wherein said first side signal terminals, which constitute said first terminal array, are exposed on the first main surface of said ceramic subsidiary core portion, and a signal subsidiary core conductor, which corresponds to the first side signal terminals and is conductively connected to said second side signal terminals of said second terminal array, extends transversely of the ceramic subsidiary core portion.

16. The intermediate substrate according to claim 14 wherein, outside of said ceramic subsidiary core portion, only the first main surface of said main core body portion is covered with a first wiring layer portion comprising alternate laminated layers comprising at least one dielectric layer comprised of polymer material and at least one conductive layer containing a surface conductor for serving a wiring, ground or supply power function, and said first side signal terminals are exposed on the surface of said first wiring layer portion, and a first side signal wiring, which provides a signal transmission path outside of said ceramic subsidiary core portion, is disposed within said first wiring layer portion so as to be conductively connected to said first side signal terminals, and a terminal end of the first side signal wiring is conductively connected to a signal through hole conductor which extends transversely of said main core body portion and which bypasses said ceramic subsidiary core portion.

17. An intermediate substrate comprising:

a substrate core comprising a main core body portion constructed of a sheet of polymer material and including a subsidiary core accommodation portion opening at a first main surface of the main core body portion so as to reduce the overall transverse thickness thereof in the region of said subsidiary core accommodation portion, and a subsidiary core portion, constructed of a material having a smaller linear expansion coefficient than said main core body portion, accommodated in said subsidiary core accommodation portion and having a thickness which, together with the transverse thickness of any remaining portion of said main core body portion in said region, matches the overall transverse thickness of said main core body portion;

a first terminal array formed on a first main surface side of said substrate core and comprising first side first terminals and first side second terminals some of which function as power terminals and others of which function as ground terminals, said first terminal array further comprising first side signal terminals; and a second terminal array formed on a second main surface side of said substrate core and comprising second side first terminals and second side second terminals which are conductively connected to said first side first terminals and said first side second terminals, respectively, and second side signal terminals conductively connected to said first side signal terminals;

said first terminal array being disposed at a position overlapping a resultant projected area of said subsidiary core portion produced by geometric projection of said subsidiary core portion orthogonally onto a reference plane parallel to a planar face of said substrate core, and said intermediate substrate further comprising, accommodated in said subsidiary core portion, a multilayered capacitor, comprising, in order, a first conductive electrode layer, a dielectric layer and a second conductive electrode layer, and conductively connected to said first side second terminals and said second side second terminals.

18. The intermediate substrate according to claim 17 wherein, in said substrate core, the first main surface of said subsidiary core portion, and the first main surface of said main core body portion are covered with a first wiring layer portion comprising alternate layers comprising at least one dielectric layer comprised of polymer material and at least one conductive layer including a surface conductor functioning as wiring, ground or power supply conductors, and said first terminal array is exposed on the first main surface of the first wiring layer portion.

19. The intermediate substrate according to claim 18 wherein a first subsidiary core conductor and a second subsidiary core conductor, corresponding to said first side first terminals and first side second terminals of said first terminal array and conductively connected to said second side first terminals and second side second terminals of said second terminal array, extend transversely of said subsidiary core portion, the first subsidiary core conductor and the second subsidiary core conductor being conductively connected to said first side first terminals and first side second terminals through via conductors penetrating through the at least one dielectric layer of said first wiring layer portion.

20. The intermediate substrate according to claim 18 wherein, in said first terminal array, said first side first terminals and first side second terminals are disposed within an inside array area and said first side signal terminals are disposed within an outside array area, and wherein a first side signal wiring, which provides a signal transmission path outside of said subsidiary core portion, is disposed within said first wiring layer portion so as to be conductively connected to said first side signal terminals, and a terminal end of the first side signal wiring is conductively connected to a signal through hole conductor which extends transversely of said main core body portion and which bypasses said subsidiary core portion.

21. The intermediate substrate according to claim 17 wherein said first side first terminals and said first side second terminals, which constitute said first terminal array, are exposed on the first main surface of said subsidiary core portion and a first subsidiary core conductor and a second subsidiary core conductor, which correspond to said first side first terminals and said first side second terminals of said first terminal array and are conductively connected to said second side first terminals and second side second terminals of said second terminal array, extend transversely of the core portion.

22. The intermediate substrate according to claim 21 wherein an outer peripheral portion of the first main surface of said subsidiary core portion has disposed thereon a first wiring layer portion comprising alternating layers comprising at least one dielectric layer comprised of a polymer material and at least one conductive layer containing a surface conductor for serving a wiring, ground or power supply function, together with the first main surface of said core main body portion, and said first side signal terminals are exposed on the surface of said first wiring layer portion, and wherein a first side signal wiring, which provides a signal transmission path outside of the subsidiary core portion, is disposed within said first wiring layer portion and is conductively connected to said first side signal terminals, and a terminal end of the first side signal wiring is conductively connected to a signal through hole conductor which extends transversely of said main core body portion and which bypasses said subsidiary core portion.

23. An intermediate substrate comprising:

a substrate core comprising a main core body portion constructed of a sheet of polymer material and including subsidiary core accommodation portion opening at a first main surface of the main core body portion so as to reduce the overall transverse thickness thereof in the region of said subsidiary core accommodation portion, and a subsidiary core portion, constructed of material having a coefficient of linear expansion smaller than that of said main core body portion, accommodated in said subsidiary core accommodation portion and of a thickness which, together with the transverse thickness of any remaining portion of said main core body portion in said region, matches the overall transverse thickness of said main core body portion;

a first terminal array formed on a first main surface of said substrate core and comprising first side first terminals and first side second terminals functioning as power terminals and ground terminals, respectively, and first side signal terminals; and a second terminal array formed on a second main surface of said substrate core and comprising second side first terminals and second side second terminals, conductively connected to said first side first terminals and said first side second terminals, and second side signal terminals conductively connected to said first side signal terminals;

said first terminal array being positioned entirely within a projected area of said subsidiary core portion geometrically projected orthogonally into a reference plane parallel to a planar face of said substrate core and said substrate further comprising a multilayered capacitor, comprising first and second conductive electrode layers separated by a dielectric layer, conductively connected to said first side second terminal and said second side second terminals and accommodated in said subsidiary core accommodation portion.

* * * * *